US012174651B1

(12) United States Patent
Rattan

(10) Patent No.: US 12,174,651 B1
(45) Date of Patent: Dec. 24, 2024

(54) CAPACITOR-LESS LINEAR LOW DROP OUT VOLTAGE REGULATING SYSTEM AND METHOD WITH ENHANCED PSR, LINE-TRANSIENT AND LOAD-TRANSIENT RESPONSES

(71) Applicant: 1-VIA LTD, Reading (GB)

(72) Inventor: Suhas Rattan, Reading (GB)

(73) Assignee: 1-VIA LTD, Reading (GB)

(*) Notice: Subject to any disclaimer, the term of this patent is extended or adjusted under 35 U.S.C. 154(b) by 0 days.

(21) Appl. No.: 18/659,472

(22) Filed: May 9, 2024

(51) Int. Cl.
| | | |
|---|---|---|
| *G05F 1/575* | (2006.01) | |
| *H02M 1/00* | (2007.01) | |
| *H03F 3/193* | (2006.01) | |
| *H03G 1/00* | (2006.01) | |
| *H03M 1/66* | (2006.01) | |

(52) U.S. Cl.
CPC .......... *G05F 1/575* (2013.01); *H02M 1/0025* (2021.05); *H03F 3/193* (2013.01); *H03G 1/0029* (2013.01); *H03M 1/66* (2013.01)

(58) Field of Classification Search
CPC . G05F 1/575; G05F 1/56; H03M 1/66; H03G 1/0029; H02M 1/0025; H03F 3/193
See application file for complete search history.

(56) References Cited

U.S. PATENT DOCUMENTS

| | | | |
|---|---|---|---|
| 7,554,307 B2 | 6/2009 | Moraveji | |
| 8,294,441 B2* | 10/2012 | Gurcan | G05F 1/575 323/280 |
| 9,292,026 B2* | 3/2016 | Bhattad | G05F 1/56 |
| 9,710,003 B2* | 7/2017 | El-Nozahi | G05F 1/575 |
| 9,933,801 B1* | 4/2018 | Guan | G05F 1/575 |
| 9,946,283 B1* | 4/2018 | Yung | G05F 1/575 |
| 10,203,710 B2* | 2/2019 | Bhattad | G05F 1/575 |
| 10,386,877 B1* | 8/2019 | Magen | G05F 1/575 |
| 2005/0189930 A1* | 9/2005 | Wu | G05F 1/575 323/280 |
| 2019/0258282 A1* | 8/2019 | Magod Ramakrishna | G05F 1/575 |

(Continued)

FOREIGN PATENT DOCUMENTS

CN 115328254 A * 11/2022

OTHER PUBLICATIONS

Translation CN-115328254-A, (Year: 2022).*

*Primary Examiner* — Thienvu V Tran
*Assistant Examiner* — Yahveh Comas Torres
(74) *Attorney, Agent, or Firm* — Kevin J Fournier Intellectual Property Legal Services Ltd.; Kevin J Fournier

(57) ABSTRACT

A capacitor-less linear Low Drop Out (LDO) Voltage Regulating (VR) system and method with enhanced Power Supply Rejection (PSR), line transient response, and load transient response is disclosed. The system includes a current-summing amplifier to refine input voltage and error signals from an error amplifier circuit, improving regulation accuracy. Further, the system includes a Dynamic Current Bleeder (DCB) circuit to manage current flow, optimizing efficiency. Furthermore, a strategically placed compensation capacitor ensures stable voltage delivery despite load or input changes. To further enhance performance, a boost and reduce amplifier circuit continuously monitors and adjusts current of the error amplifier circuit, minimizing output voltage variations. The system effectively manages applications demanding highly regulated and stable voltage supplies.

20 Claims, 11 Drawing Sheets

(56) References Cited

U.S. PATENT DOCUMENTS

2021/0311513 A1\* 10/2021 Joshi .................. G05F 1/575
2021/0397207 A1\* 12/2021 Joo .................... G05F 1/575
2023/0055611 A1\* 2/2023 Joshi .................. G05F 1/575
2024/0281014 A1\* 8/2024 Okada ................ G05F 1/575

\* cited by examiner

CAPACITOR-LESS LINEAR LOW DROP OUT VOLTAGE REGULATING SYSTEM AND METHOD WITH ENHANCED PSR, LINE-TRANSIENT AND LOAD-TRANSIENT RESPONSES

TECHNICAL FIELD

Embodiments of the present disclosure generally relates to voltage regulators and, more specifically, to a capacitor-less linear Low Drop Out (LDO) Voltage Regulating (VR) system and method with enhanced Power Supply Rejection (PSR), line transient response, and load transient response.

BACKGROUND

Generally, voltage regulators may include a standard architecture with an input voltage and an output voltage. Unlike conventional voltage regulators that require a bulky external capacitor, a capacitorless-based Low Dropout (LDO) Voltage Regulator (VR) (LDOVR) eliminates the need of a bulky external capacitor, by incorporating the capacitance directly on-chip.

However, the conventional LDOVRs suffer from a Power Supply Rejection (PSR), due to issues with the transfer function of the LDO. The PSR refers to an ability of the regulator to reject or attenuate variations or noise present in an input power supply. The transfer function characterizes the frequency response from the input to the output of the conventional LDOVR. The response encompasses both the desired input signal and the ability to reject any external disturbances, such as noise. Analyzing the transfer function allows for examination of the input signal frequencies influence on the output voltage of the conventional LDOVRs. Essentially, implies that there may be limitations in the conventional LDOVR for responding to fluctuations or disturbances in the input voltage, which can lead to inadequate rejection of these variations, thereby impacting the stability and reliability of the output voltage. At a unity gain bandwidth, any noise on the input directly affects the output. To illustrate, consider an input voltage of 900 millivolts with 20 millivolts of ripple, which indicates direct impact on the output. Further, in the conventional LDOVRs, the frequency characteristic may exhibit a peak at the unity gain bandwidth of an amplifier. At this point, the loop gain of the amplifier may be approximately-40 decibel (dB), which implies that a signal or noise or disturbance on the reference voltage is significantly attenuated. However, any noise present in or on the input voltage source, such as that from a mobile phone battery, may still affect the output, emphasizing the importance of the PSR.

Conventionally, the architecture of the LDOVRs may include an error amplifier, a pass switch, and a resistive divider feedback, which may not address the issues related to a load transient response and a line transient response, and in turn the PSR. Additionally, absence of feed-forward and feedback components in the conventional LDOVRs may often necessitate the use of off-chip capacitors to address the PSR. The off-chip capacitors may usually be large and may not be integrated on-chip, adding to the size of the circuit. Furthermore, the conventional LDOVRs may function based on a principle of maintaining the output voltage at a fixed level by comparing the feedback voltage from the output with a feedback factor determined by a resistive divider. This comparison is performed against a stable voltage reference, often derived from a bandgap, which remains constant despite variations in a Process, Voltage, and Temperature (PVT). Subsequently, the error amplifier adjusts the gate voltage of the pass switch, based on the error voltage obtained from comparing the reference and feedback voltages. This adjustment ensures that the output voltage of the conventional LDOVR may remain consistent under various load conditions, including minimum and maximum current and capacitance. However, the conventional LDOVRs may include limitations such as an inadequate Power Supply Rejection (PSR), lack of adequate transient load and line regulation performance, and a necessity for a large off-chip capacitor to stabilize the conventional LDOVRs.

Consequently, there may be a need to provide improved capacitor-less linear Low Drop Out (LDO) Voltage Regulating (VR) system and method with enhanced Power Supply Rejection (PSR), line transient response, and load transient response, to address at least the aforementioned issues in the prior art.

SUMMARY

This summary is provided to introduce a selection of concepts, in a simple manner, which is further described in the detailed description of the disclosure. This summary is neither intended to identify key or essential inventive concepts of the subject matter nor to determine the scope of the disclosure.

An aspect of the present disclosure provides a linear Low Drop Out (LDO) Voltage Regulating (VR) system. The linear LDOVR system includes a first stage comprising an error amplifier circuit. The error amplifier circuit receives a pre-defined reference voltage, and a feedback voltage corresponding to an output voltage of the linear LDOVR system. Further, the error amplifier circuit compares the received pre-defined reference voltage and the feedback voltage corresponding to the output voltage. The error amplifier circuit generates an error amplified signal corresponding to an error output voltage, based on the comparison of the pre-defined reference voltage and the feedback voltage.

Furthermore, the linear LDOVR system includes a feed-forward stage. The feed-forward stage includes a current summing amplifier circuit communicatively coupled to an output node of the error amplifier circuit. The current summing amplifier circuit receives the error amplified signal from the error amplifier circuit, and an input voltage via an input terminal of the current summing amplifier circuit. The received input voltage is passed through a low-pass filter to remove at least one of a high-frequency noise and an interference and generate a filtered version of the received input voltage. The filtered version of the received input voltage is amplified using a first transistor associated with the current summing amplifier circuit, to generate an amplified version of the filtered input voltage. The input voltage via the input terminal is connected to a source of one or more transistors of the current summing amplifier, and parasitically coupled to a gate of the first transistor. Additionally, the current summing amplifier circuit level-shifts the received error amplified signal by using a gate-source voltage of a second transistor associated with the current summing amplifier circuit. Further, the current summing amplifier circuit generates a feed-forward output voltage using the level-shifted error amplified signal, based on a summation of the filtered version of the input voltage, and an output voltage of the error amplifier circuit.

Furthermore, the feed-forward stage includes a Dynamic Current Bleeder (DCB) circuit communicatively coupled between an output node of the current summing amplifier circuit and an output node of the linear LDOVR system. The DCB circuit receives the feed-forward output voltage from the current summing amplifier circuit. Further, the DCB circuit level-shifts the received feed-forward output voltage by using a gate-source voltage of a third transistor associated with the DCB circuit, to generate a level-shifted output voltage. The level-shifted output voltage corresponds to a source voltage of the third transistor. Furthermore, the DCB circuit determines via a bleed transistor, if the generated level-shifted output voltage is greater than a threshold voltage of the bleed transistor associated with the DCB circuit. Additionally, the bleed transistor dynamically switches-on to bleed a current from the output node of the linear LDOVR system, when the determined level-shifted output voltage is greater than the threshold voltage of the bleed transistor associated with the DCB circuit. Bleeding the current includes reducing a gate voltage of a pass switch transistor connected in parallel to an input node of the DCB circuit, and the output node of the DCB circuit and the linear LDOVR system.

Additionally, the feed-forward stage includes a Compensation capacitor (Cc) communicatively coupled between the output node of the error amplifier circuit and the output node of the linear LDOVR system. The Cc creates, via a miller effect, a dominant pole at the output node of the error amplifier circuit. Further, the Cc optimizes a Power Supply Rejection (PSR) response of the linear LDOVR system, by using the current summing amplifier circuit, and optimize a load transient response and a line transient response of the linear LDOVR system, using a boost and reduce amplifier circuit.

Furthermore, the linear LDOVR system includes a feedback stage. The feedback stage includes the boost and reduce amplifier circuit communicatively coupled to the output node of the linear LDOVR system. The boost and reduce amplifier circuit senses, via a feedback loop, the output voltage of the linear LDOVR system. Further, the boost and reduce amplifier circuit detects an event comprising at least one of a droop signal and a shoot signal via a first capacitor C1 associated with the boost and reduce amplifier circuit, based on the sensed output voltage of the linear LDOVR system. Additionally, the boost and reduce amplifier circuit amplifies and invert the output voltage of the linear LDOVR system, based on detecting the event comprising at least one of the droop signal and the shoot signal at the output voltage of the linear LDOVR system. Further, the boost and reduce amplifier circuit boosts a tail current in a tail node of the error amplifier circuit, when the detected event corresponds to the droop signal, using the amplified and inverted output voltage of the linear LDOVR system. Furthermore, the boost and reduce amplifier circuit reduces the tail current in the tail node of the error amplifier circuit, when the detected event corresponds to the shoot signal, to decrease a magnitude of at least one of the droop signal and the shoot signal, and for enhancing the load transient response and the line transient response.

Additionally, the feedback stage includes a resistive divider circuit communicatively coupled to the output node of the linear LDOVR system and the input node of the error amplifier circuit. The resistive divider circuit generates a divided feedback voltage from the output voltage of the linear LDOVR system, to regulate the error amplified signal of the error amplifier circuit, using a resistive ratio of the resistive divider circuit, corresponding to a feedback factor. Further, the linear LDOVR system includes a second stage. The second stage includes the pass switch transistor. The pass switch transistor includes an input node is communicatively coupled between the output node of the current summing amplifier circuit and the input node of the DCB circuit, and an output node of the pass switch transistor is communicatively coupled to the input node of the error amplifier circuit. The pass switch transistor receives a gate voltage associated with the pass switch transistor based on the feed-forward output voltage from the current summing amplifier circuit and regulates the output voltage of the linear LDOVR system, based on the received gate voltage corresponding to the feed-forward output voltage from the current summing amplifier circuit.

Another aspect of the present disclosure provides a linear Low Drop Out (LDO) Voltage Regulating (VR) method. The method includes receiving a pre-defined reference voltage, and a feedback voltage corresponding to an output voltage of the linear LDOVR system, using an error amplifier circuit. Further, the method includes comparing the received pre-defined reference voltage and the feedback voltage corresponding to the output voltage. Furthermore, the method includes generating an error amplified signal corresponding to an error output voltage, based on the comparison of the pre-defined reference voltage and the feedback voltage. Additionally, the method includes level-shifting the generated error amplified signal by using a gate-source voltage of a second transistor associated with a current summing amplifier circuit. The current summing amplifier circuit receives input voltage via an input terminal, and the input voltage is passed through a low-pass filter to remove at least one of a high-frequency noise and an interference and generate a filtered version of the received input voltage. The filtered version of the received input voltage is amplified using a first transistor associated with the current summing amplifier circuit, to generate an amplified version of the filtered input voltage.

Further, the method includes generating a feed-forward output voltage using the level-shifted error amplified signal, based on a summation of the filtered version of the input voltage, and an output voltage of the error amplifier circuit. Furthermore, the method includes level-shifting the generated feed-forward output voltage by using a gate-source voltage of a third transistor associated with a Dynamic Current Bleeder (DCB) circuit, to generate a level-shifted output voltage. The level-shifted output voltage corresponds to a source voltage of the third transistor. Further, the method includes determining, via a bleeder transistor, if the generated level-shifted output voltage is greater than a threshold voltage of the bleed transistor associated with the DCB circuit. Furthermore, the method includes dynamically switching-on the bleed transistor to bleed a current from the output node of the linear LDOVR system, when the determined level-shifted output voltage is greater than the threshold voltage of the bleed transistor associated with the DCB circuit. Bleeding the current comprises reducing a gate voltage of a pass switch transistor connected in parallel to an input node of the DCB circuit, and the output node of the DCB circuit and the linear LDOVR system.

Additionally, the method includes creating, via a miller effect, a dominant pole at the output node of the error amplifier circuit, using a Compensation capacitor (Cc). Further, the method includes optimizing a Power Supply Rejection (PSR) response of the linear LDOVR system, by using the current summing amplifier circuit, and optimize a load transient response and a line transient response of the linear LDOVR system, using a boost and reduce amplifier circuit. Furthermore, the method includes sensing, via a feedback loop, the output voltage of the linear LDOVR system, using the boost and reduce amplifier circuit. Additionally, the method includes detecting an event comprising at least one of a droop signal and a shoot signal via a first capacitor C1 associated with the boost and reduce amplifier circuit, based on the sensed output voltage of the linear LDOVR system. Furthermore, the method includes amplifying and inverting the output voltage of the linear LDOVR system, based on detecting the event comprising at least one of the droop signal and the shoot signal at the output voltage of the linear LDOVR system.

Further, the method includes boosting a tail current in a tail node of the error amplifier circuit, when the detected event corresponds to the droop signal, using the amplified and inverted output voltage of the linear LDOVR system. Furthermore, the method includes reducing the tail current in the tail node of the error amplifier circuit, when the detected event corresponds to the shoot signal, to decrease a magnitude of at least one of the droop signal and the shoot signal, and for enhancing the load transient response and the line transient response. Additionally, the method includes generating a divided feedback voltage from the output voltage of the linear LDOVR system, to regulate the error amplified signal of the error amplifier circuit, using a resistive ratio of a resistive divider circuit, corresponding to a feedback factor, using the resistive divider circuit. Further, the method includes receiving a gate voltage associated with the pass switch transistor, based on the feed-forward output voltage from the current summing amplifier circuit, using the pass switch transistor. Furthermore, the method includes regulating the output voltage of the linear LDOVR system, based on the received gate voltage corresponding to the feed-forward output voltage from the current summing amplifier circuit.

Yet another aspect of the present disclosure provides a voltage regulator. The voltage regulator includes a feed-forward stage. The feed-forward stage includes a current summing amplifier circuit communicatively coupled to an output node of an error amplifier circuit. The current summing amplifier circuit receives an error amplified signal from the error amplifier circuit, and an input voltage via an input terminal of the current summing amplifier circuit. The received input voltage is passed through a low-pass filter to remove at least one of a high-frequency noise and an interference and generate a filtered version of the received input voltage. The filtered version of the received input voltage is amplified using a first transistor associated with the current summing amplifier circuit, to generate an amplified version of the filtered input voltage. The input voltage via the input terminal is connected to a source of one or more transistors of the current summing amplifier, and parasitically coupled to a gate of the first transistor. Further, the current summing amplifier circuit level-shifts the received error amplified signal by using a gate-source voltage of a second transistor associated with the current summing amplifier circuit. Furthermore, the current summing amplifier circuit generates a feed-forward output voltage using the level-shifted error amplified signal, based on a summation of the filtered version of the input voltage and an output voltage of the error amplifier circuit.

Further, the feed-forward stage includes a Dynamic Current Bleeder (DCB) circuit communicatively coupled between an output node of the current summing amplifier circuit and an output node of the voltage regulator. The DCB circuit receives the feed-forward output voltage from the current summing amplifier circuit. Further, the DCB circuit level-shifts the received feed-forward output voltage by using a gate-source voltage of a third transistor associated with the DCB circuit, to generate a level-shifted output voltage. The level-shifted output voltage corresponds to a source voltage of the third transistor. Furthermore, the DCB circuit determines via a bleed transistor, if the generated level-shifted output voltage is greater than a threshold voltage of the bleed transistor associated with the DCB circuit. Furthermore, the bleed transistor dynamically switches-on to bleed a current from the output node of the linear LDOVR system, when the determined level-shifted output voltage is greater than the threshold voltage of the bleed transistor associated with the DCB circuit. Bleeding the current comprises reducing a gate voltage of a pass switch transistor connected in parallel to an input node of the DCB circuit, and the output node of the DCB circuit and the voltage regulator.

Further, the feed-forward stage includes a Compensation capacitor (Cc) communicatively coupled between the output node of the error amplifier circuit and the output node of the voltage regulator. The Cc creates, via a miller effect, a dominant pole at the output node of the error amplifier circuit. Further, the Cc optimizes a Power Supply Rejection (PSR) response of the voltage regulator, by using the current summing amplifier circuit, and optimize a load transient response and a line transient response of the voltage regulator, using a boost and reduce amplifier circuit.

Further, the feed-forward stage includes a feedback stage. The feedback stage includes a boost and reduce amplifier circuit communicatively coupled to the output node of the voltage regulator. The boost and reduce amplifier circuit senses, via a feedback loop, the output voltage of the voltage regulator. Further, the boost and reduce amplifier circuit detects an event comprising at least one of a droop signal and a shoot signal via a first capacitor C1 associated with the boost and reduce amplifier circuit, based on the sensed output voltage of the voltage regulator. Furthermore, the boost and reduce amplifier amplifies and invert the output voltage of the voltage regulator, based on detecting the event comprising at least one of the droop signal and the shoot signal at the output voltage of the voltage regulator. Additionally, the boost and reduce amplifier boosts a tail current in a tail node of the error amplifier circuit, when the detected event corresponds to the droop signal, using the amplified and inverted output voltage of the voltage regulator. Furthermore, the boost and reduce amplifier reduces the tail current in the tail node of the error amplifier circuit, when the detected event corresponds to the shoot signal, to decrease a magnitude of at least one of the droop signal and the shoot signal, and for enhancing the load transient response and the line transient response. Further, the voltage regulator includes a resistive divider circuit communicatively coupled to the output node of the voltage regulator and the input node of the error amplifier circuit. The resistive divider generates a divided feedback voltage from the output voltage of the voltage regulator, to regulate the error amplified signal of the error amplifier circuit, using a resistive ratio of the resistive divider circuit, corresponding to a feedback factor.

To further clarify the features of the present disclosure, a more particular description of the disclosure will follow by reference to specific embodiments thereof, which are illustrated in the appended figures. It is to be appreciated that these figures depict only typical embodiments of the disclosure and are therefore not to be considered limiting in scope. The disclosure will be described and explained with additional specificity and detail with the appended figures.

BRIEF DESCRIPTION OF THE DRAWINGS

Features of the disclosed embodiments are illustrated by way of example and not limited in the following Figure(s), in which like numerals indicate like elements, in which.

Figure 1:
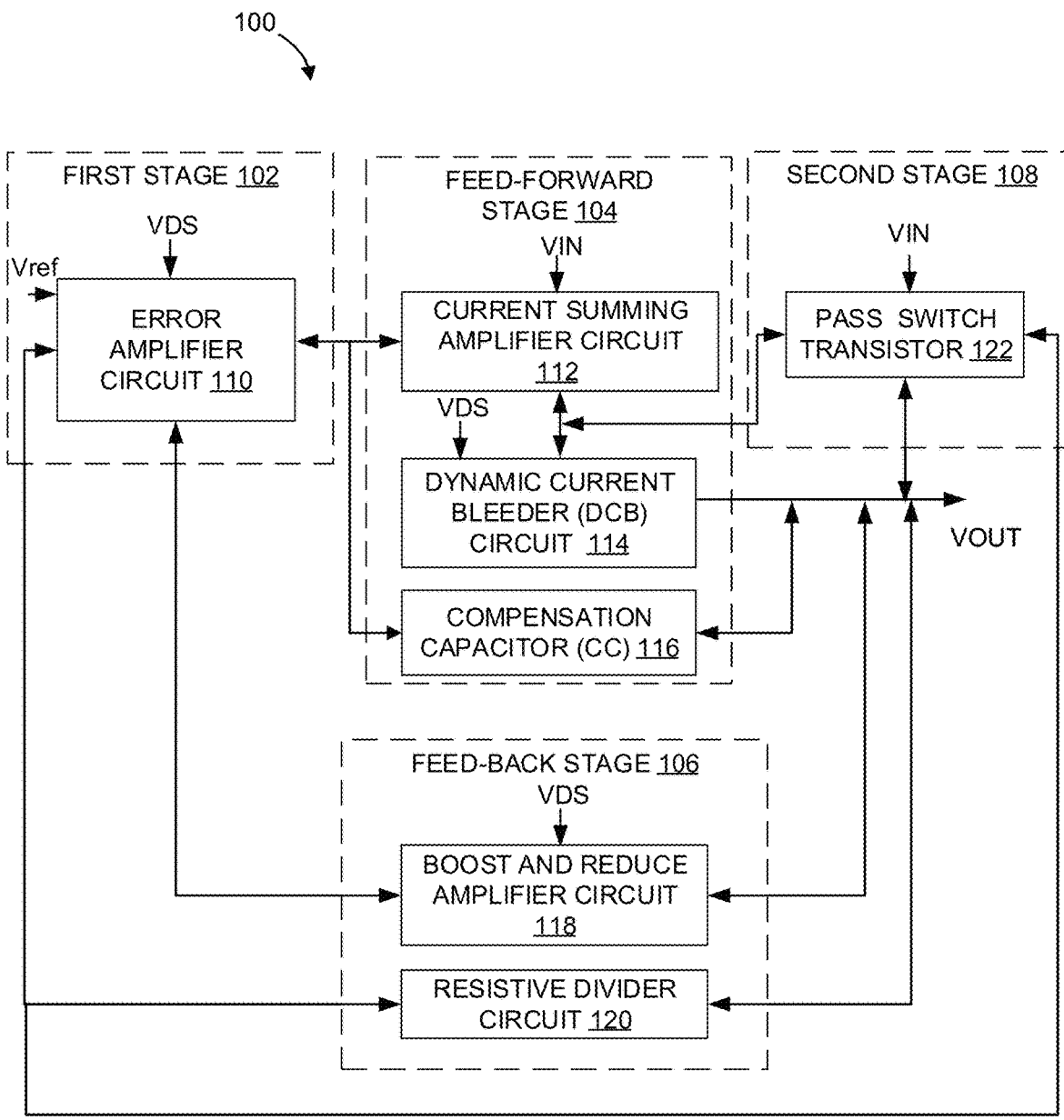
FIG. 1 illustrates an exemplary block diagram representation of a circuit architecture for a capacitor-less linear Low Drop Out (LDO) Voltage Regulating (VR) system with enhanced Power Supply Rejection (PSR), line transient response, and load transient response, according to an example embodiment of the present disclosure.

Further, those skilled in the art will appreciate that elements in the figures are illustrated for simplicity and may not have necessarily been drawn to scale. Furthermore, in terms of the construction of the device, one or more components of the device may have been represented in the figures by conventional symbols, and the figures may show only those specific details that are pertinent to understanding the examples of the present disclosure so as not to obscure the figures with details that will be readily apparent to those skilled in the art having the benefit of the description herein.

DETAILED DESCRIPTION

For simplicity and illustrative purposes, the proposed approach and solutions are described by referring mainly to examples and embodiments thereof. In the following description, numerous specific details are set forth in order to provide a thorough understanding of the proposed approach and solutions. It will be readily apparent, however, that the proposed approach and solutions may be practiced without limitation to these specific details. In other instances, some methods and structures readily understood by one of ordinary skill in the art have not been described in detail so as not to unnecessarily obscure the ongoing description.

As used herein, the terms "a" and "an" are intended to denote at least one of a particular element, the term "includes" means includes but not limited to, the term "including" means including but not limited to, and the term "based on" means based at least in part on, the term "based upon" means based at least in part upon, and the term "such as" means such as but not limited to. The term "relevant" means closely connected or appropriate to what is being performed or considered.

The terms "comprise", "comprising", or any other variations thereof, are intended to cover a non-exclusive inclusion, such that one or more devices or sub-systems or elements or structures or components preceded by "comprises . . . a" does not, without more constraints, preclude the existence of other devices, sub-systems, additional sub-modules. Appearances of the phrase "in an embodiment", "in an exemplary embodiment", "in another embodiment" and similar language throughout this specification may, but not necessarily do, all refer to the same embodiment.

It will be understood that, although the terms first, second, third, fourth, and the like, may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A Low-Dropout Voltage Regulator (which may be referred to herein as "an LDO voltage regulator," "an LDO regulator," or simply "an LDOVR") is one that can regulate the output voltage even when the supply voltage is may be close to the output voltage: when Output Voltage Drop (VDO) may be small, Input Voltage (VIN) can be very close to Out Voltage (VOUT) and the regulator may still operate correctly.

The LDOVR may use at least one of, but not limited to, Bipolar Junction Transistors (BJTs), Field-Effect Transistors (FETs), complementary Metal Oxide Semiconductor (MOS) transistors, and the like. Conventional LDOVR architectures that require external capacitor to guarantee the stability of the LDOVR may usually have superior performance over the other type. These performance parameters may include both superior Power Supply Rejection (PSR) and load transient regulation. The PSR may be the ability of the LDOVR to reject any noise generated from the power supply. Throughout this disclosure, the terms, "power supply", "supply", "VIN", and "VIN terminal" may be used interchangeably to refer to the power source input to a voltage regulator. Further, the load transient regulation may be the change in the output voltage (Vout), when there is an instantaneous change in a load current (IL).

On the other hand, the LDOVRs that do not require an external capacitor are referred to as capacitor-less LDOVRs. Generally, the capacitor-less LDOVRs may use on-chip capacitors. The main advantage of the capacitor-less implementation may be that the capacitor-less LDOVRs may not require an external capacitor. This helps to reduce the cost of any device that uses the capacitor-less LDOVRs. Capacitor-less LDOVRs may be used to supply power to multiple circuits inside Systems-On-a-Chip (SOCs) and microprocessors, including embedded memories, Delay Lock Loops (DLLs), Phase Lock Loops (PLLs), high-speed interfaces, and the like. The main drawback of the capacitor-less LDOVRs architectures is that both the PSR and the load transient regulation may be much worse than the conventional LDOs using the external capacitors. Conventional designs for capacitor-less LDOVRs architectures reported the PSR less than 50 dB at 1 MHZ, and the load and line transient regulation less than 1V, when the load current changes from 1 to 200 mA in 1 µsec. Increasing the load current, the two parameters such as the PSR, and load and line transient responses deteriorate further. In traditional capacitor-less LDOVR architectures, boosting the maximum current to 500 mA results in a degradation of the PSR to below 30 dB at 1 MHz. These two performance parameters show that the capacitor-less LDOVR cannot be used in many applications that require superior performance of the PSR, and the load and line transient regulation.

Throughout this disclosure, the terms "LDO/load switch linear voltage regulator" refers to either an LDO or a load depending on specific configurations of the reference voltage used.

In one or more embodiments, the improved capacitor-less linear LDOVR may include a dominant pole at the LDO output node (i.e., the terminal) instead of placing the dominant pole in the feedback network. Placing the dominant pole at the LDO output node increases the speed of the feedback network such that the LDO reacts to load current variations and supply noise variations with improved response time. This leads to better PSR and transient load regulation.

Within this disclosure, different entities (which may variously be referred to as "units", "circuits", other components, and the like.) may be described or claimed as "configured" to perform one or more tasks or operations. This formulation [entity] configured to [perform one or more tasks] is used herein to refer to structure (i.e., something physical, such as an electronic circuit). More specifically, this formulation is used to indicate that this structure is arranged to perform the one or more tasks during operation. A structure can be said to be "configured to" perform some tasks even if the structure is not currently being operated. A "an error amplifier circuit configured to receive a pre-defined reference voltage, and a feedback voltage corresponding to an output voltage of a linear Low Drop Out (LDO) Voltage Regulating (VR) system" is intended to cover, for example, an integrated circuit that has circuitry that performs this function during operation, even if the integrated circuit in question is not currently being used (e.g., a power supply is not connected). Thus, an entity described or recited as "configured to" perform some tasks refers to something physical, such as a device, circuit, memory storing program instructions executable to implement the task, etc. This phrase is not used herein to refer to something intangible.

The term "configured to" is not intended to mean "configurable to" An unprogrammed Field Programmable Gate Arrays (FPGAs), for example, would not be considered to be "configured to" perform some specific function, although it may be "configurable to" perform that function after programming. Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on".

As used herein, the phrase "in response to" describes one or more factors that trigger an effect. This phrase does not foreclose the possibility that additional factors may affect or otherwise trigger the effect. That is, an effect may be solely in response to those factors or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

When used in the claims, the term "or" is used as an inclusive or and not as an exclusive or. For example, the phrase "at least one of x, y, or z" means any one of x, y, and z, as well as any combination thereof.

Unless otherwise defined, all technical and scientific terms used herein have the same meaning as commonly understood by those skilled in the art to which this disclosure belongs. The system, methods, and examples provided herein are only illustrative and not intended to be limiting.

Disclosed herein are linear regulators (e.g., a low dropout regulator or "LDO", or a linear amplifier) with a switch and a control circuit coupled to the switch, wherein the control circuit includes a mode selection circuit with a slow loop configured to sample a load current and with a fast loop configured to detect an output voltage error signal. In some examples, the mode selection circuit is configured to adjust the mode of a reference voltage circuit for an error amplifier between a continuous power mode and a duty cycle power save mode (e.g., a sample-and-hold mode or duty-cycle mode) based on the sampled load current and the output voltage error signal. With the mode selection circuit, power savings are achieved in that the quiescent current (Iq) of the mode detect circuit is below 1 nA when there is no load. Also, the mode selection circuit may be able to respond quickly to changing load conditions without toggling. The PSR, which is the ability to reject noise from the power supply, is one important characteristic of a low drop out (LDO) linear voltage regulator. The supply rejection of some LDO linear voltage regulators depends on the loop gain of the regulator.

The present disclosure provides a linear Low Drop Out (LDO) Voltage Regulating (VR) system. The linear LDOVR system includes a first stage comprising an error amplifier circuit. The error amplifier circuit receives a pre-defined reference voltage, and a feedback voltage corresponding to an output voltage of the linear LDOVR system. Further, the error amplifier circuit compares the received pre-defined reference voltage and the feedback voltage corresponding to the output voltage. The error amplifier circuit generates an error amplified signal corresponding to an error output voltage, based on the comparison of the pre-defined reference voltage and the feedback voltage.

Furthermore, the linear LDOVR system includes a feed-forward stage. The feed-forward stage includes a current summing amplifier circuit communicatively coupled to an output node of the error amplifier circuit. The current summing amplifier circuit receives the error amplified signal from the error amplifier circuit, and an input voltage via an input terminal of the current summing amplifier circuit. The received input voltage is passed through a low-pass filter to remove at least one of a high-frequency noise and an interference and generate a filtered version of the received input voltage. The filtered version of the received input voltage is amplified using a first transistor associated with the current summing amplifier circuit, to generate an amplified version of the filtered input voltage. The input voltage via the input terminal is connected to a source of one or more transistors of the current summing amplifier, and parasitically coupled to a gate of the first transistor. Additionally, the current summing amplifier circuit level-shifts the received error amplified signal by using a gate-source voltage of a second transistor associated with the current summing amplifier circuit. Further, the current summing amplifier circuit generates a feed-forward output voltage using the level-shifted error amplified signal, based on a summation of the filtered version of the input voltage, and an output voltage of the error amplifier circuit.

Furthermore, the feed-forward stage includes a Dynamic Current Bleeder (DCB) circuit communicatively coupled between an output node of the current summing amplifier circuit and an output node of the linear LDOVR system. The DCB circuit receives the feed-forward output voltage from the current summing amplifier circuit. Further, the DCB circuit level-shifts the received feed-forward output voltage by using a gate-source voltage of a third transistor associated with the DCB circuit, to generate a level-shifted output voltage. The level-shifted output voltage corresponds to a source voltage of the third transistor. Furthermore, the DCB circuit determines via a bleed transistor, if the generated level-shifted output voltage is greater than a threshold voltage of the bleed transistor associated with the DCB circuit. Additionally, the bleed transistor dynamically switches-on to bleed a current from the output node of the linear LDOVR system, when the determined level-shifted output voltage is greater than the threshold voltage of the bleed transistor associated with the DCB circuit. Bleeding the current includes reducing a gate voltage of a pass switch transistor connected in parallel to an input node of the DCB circuit, and the output node of the DCB circuit and the linear LDOVR system.

Additionally, the feed-forward stage includes a Compensation capacitor (Cc) communicatively coupled between the output node of the error amplifier circuit and the output node of the linear LDOVR system. The Cc creates, via a miller effect, a dominant pole at the output node of the error amplifier circuit. Further, the Cc optimizes a Power Supply Rejection (PSR) response of the linear LDOVR system, by using the current summing amplifier circuit, and optimize a load transient response and a line transient response of the linear LDOVR system, using a boost and reduce amplifier circuit.

Furthermore, the linear LDOVR system includes a feed-back stage. The feed-back stage includes the boost and reduce amplifier circuit communicatively coupled to the output node of the linear LDOVR system. The boost and reduce amplifier circuit senses, via a feedback loop, the output voltage of the linear LDOVR system. Further, the boost and reduce amplifier circuit detects an event comprising at least one of a droop signal and a shoot signal via a first capacitor C1 associated with the boost and reduce amplifier circuit, based on the sensed output voltage of the linear LDOVR system. Additionally, the boost and reduce amplifier circuit amplifies and invert the output voltage of the linear LDOVR system, based on detecting the event comprising at least one of the droop signal and the shoot signal at the output voltage of the linear LDOVR system. Further, the boost and reduce amplifier circuit boosts a tail current in a tail node of the error amplifier circuit, when the detected event corresponds to the droop signal, using the amplified and inverted output voltage of the linear LDOVR system. Furthermore, the boost and reduce amplifier circuit reduces the tail current in the tail node of the error amplifier circuit, when the detected event corresponds to the shoot signal, to decrease a magnitude of at least one of the droop signal and the shoot signal, and for enhancing the load transient response and the line transient response.

Additionally, the feed-back stage includes a resistive divider circuit communicatively coupled to the output node of the linear LDOVR system and the input node of the error amplifier circuit. The resistive divider circuit generates a divided feedback voltage from the output voltage of the linear LDOVR system, to regulate the error amplified signal of the error amplifier circuit, using a resistive ratio of the resistive divider circuit, corresponding to a feedback factor. Further, the linear LDOVR system includes a second stage. The second stage includes the pass switch transistor. The pass switch transistor includes an input node is communicatively coupled between the output node of the current summing amplifier circuit and the input node of the DCB circuit, and an output node of the pass switch transistor is communicatively coupled to the input node of the error amplifier circuit. The pass switch transistor receives a gate voltage associated with the pass switch transistor, based on the feed-forward output voltage from the current summing amplifier circuit and regulates the output voltage of the linear LDOVR system, based on the received gate voltage corresponding to the feed-forward output voltage from the current summing amplifier circuit.

Referring now to the drawings, and more particularly to FIG. 1 through FIG. 9C, where similar reference characters denote corresponding features consistently throughout the figures, there are shown preferred examples, and these examples are described in the context of the following exemplary system and/or method.

FIG. 1 illustrates an exemplary block diagram representation of a circuit architecture for a capacitor-less linear Low Drop Out (LDO) Voltage Regulating (VR) system 100 (herein after referred to as the linear LDOVR system 100) with enhanced Power Supply Rejection (PSR), line transient response, and load transient response, according to an example embodiment of the present disclosure. The linear LDOVR system 100 may be coupled to receive a voltage from an external source (e.g., Supply Voltage (VDS), Input Voltage (VIN), and the like) and to provide an output voltage to a load on an output node (Vout). In an exemplary embodiment, the linear LDOVR system 100 may include a voltage loop and a current loop, which are coupled to one another via at least one of a P-type Metal Oxide Semiconductor (PMOS) transistor and/or a N-type Metal Oxide Semiconductor (NMOS), and the like. The voltage loop includes amplifiers, the output of the amplifiers may be coupled to a gate terminal of the PMOS transistor or the NMOS transistor. An inverting input (e.g., if the pass switch transistor is PMOS) and/or a non-inverting input (e.g., if the pass switch transistor is NMOS) of the amplifier may be coupled to the output node, Vout, while the non-inverting input and/or the inverting input may be coupled to receive a reference Voltage (Vref).

Embodiments herein may include the peripherals of any desired circuitry, depending on the type of the linear LDOVR system 100. For example, in one embodiment, the linear LDOVR system 100 may be associated with a mobile device (e.g. a personal digital assistant (PDA), a smart phone, a tablet, a wearable, and the like.) and the peripherals may include devices for various types of wireless communication, such as Wireless Fidelity (Wi-Fi), Bluetooth, cellular, global positioning system, and the like. The peripherals may also include additional storage, including Random Access Memory (RAM) storage, solid-state storage, or disk storage. The peripherals may include user interface devices such as a display screen, including touch display screens or multitouch display screens, keyboard or other input devices, microphones, speakers, and the like. In other embodiments, the linear LDOVR system 100 may be associated with any type of computing system (e.g., desktop personal computer, laptop, workstation, tablet, and the like). Typically, the LDOVR systems may also comprise at least one capacitor, e.g., for a dominant pole frequency compensation at the output of the LDOVR system. A non-ideal behavior of such a capacitor can be modeled with an equivalent resistance which typically generates a zero in the loop transfer function of the LDOVR system.

According to FIG. 1, the linear LDOVR system 100 may include a first stage 102, a feed-forward stage 104, a feed-back stage 106, and a second stage 108. The linear LDOVR system 100 may also include a plurality of stages apart from mentioned stages.

In an exemplary embodiment, the first stage 102 may include an error amplifier circuit 110. The error amplifier circuit 110 may be configured to receive a pre-defined reference voltage, and a feedback voltage corresponding to an output voltage of the linear LDOVR system 100. In an exemplary embodiment, the error amplifier circuit 110 may be configured to compare the received pre-defined reference voltage and the feedback voltage corresponding to the output voltage. In an exemplary embodiment, the error amplifier circuit 110 may be configured to generate an error amplified signal corresponding to an error output voltage, based on the comparison of the pre-defined reference voltage and the feed-back voltage.

In an exemplary embodiment, the feed-forward stage 104 may include a current summing amplifier circuit 112 communicatively coupled to an output node of the error amplifier circuit 110. In an exemplary embodiment, the current summing amplifier circuit 112 may be configured to receive the error amplified signal from the error amplifier circuit 110, and an input voltage via an input terminal of the current summing amplifier circuit 112. The received input voltage may be passed through a low-pass filter (not shown in FIG. 1) to remove at least one of a high-frequency noise and an interference. Further, the low-pass filter may generate a filtered version of the received input voltage. The filtered version of the received input voltage may be amplified using a first transistor (not shown in FIG. 1) associated with the current summing amplifier circuit 112, to generate an amplified version of the filtered input voltage. The input voltage via the input terminal may be connected to a source of one or more transistors of the current summing amplifier 112, and parasitically coupled to a gate of the first transistor.

In an exemplary embodiment, the low-pass filter may include a Resistor Field Effect Transistor (RFET) (not shown in FIG. 1). The RFET may include a resistive value determined by a RFET control voltage generated by a first Digital-to-Analog Converter (DAC). Further, the low-pass filter may include a Capacitor FET (CFET) (not shown in FIG. 1). The CFET may include a capacitor value determined by a CFET control voltage generated by a second DAC (not shown in FIG. 1), a fourth transistor (not shown in FIG. 1), and a fifth transistor (not shown in FIG. 1).

In an exemplary embodiment, the fourth transistor may be configured to function as a resistor. Further, the fourth transistor may be configured to provide a resistive element in combination with a plurality of components to create a low pass filtering effect. Furthermore, the first DAC connected to the gate terminal of the fourth transistor may be configured to adjust a resistance value of the fourth transistor, to modify a cut-off frequency of the low-pass filter.

In an exemplary embodiment, the fifth transistor may be configured to function as a capacitor. The function of the fifth transistor in the low-pass filter may include providing the capacitive element in combination with a plurality of components necessary for the low-pass filter. Further, the second DAC connected to the gate terminal of the fifth transistor may be configured to adjust a capacitance value of the fifth transistor, to modify a frequency response of the low-pass filter.

In an exemplary embodiment, the current summing amplifier circuit 112 may be configured to level-shift the received error amplified signal by using a gate-source voltage of a second transistor (not shown in FIG. 1) associated with the current summing amplifier circuit 112. In an exemplary embodiment, the current summing amplifier circuit 112 may be configured to generate a feed-forward output voltage using the level-shifted error amplified signal, based on a summation of the filtered version of the input voltage, and an output voltage of the error amplifier circuit 110.

In an exemplary embodiment, the current summing amplifier circuit 112 may be further configured to adjust at least one of a Direct Current (DC) Power Supply Rejection (PSR) and an Alternating Current (AC) high frequency Power Supply Rejection (PSR). The DC PSR and AC PSR is adjusted via at least one of a Resistor Field Effect Transistor (RFET) (not shown in FIG. 1) comprising a resistive value determined by a RFET control voltage generated by a first Digital-to-Analog Converter (DAC) (not shown in FIG. 1) and a Capacitor FET (CFET) (not shown in FIG. 1) comprising a capacitor value determined by a CFET control voltage generated by a second DAC (not shown in FIG. 1). The RFET and the CFET may be configured to adjust a Power Supply Rejection (PSR) associated with the linear LDOVR system 100, based on a plurality of applications and a plurality of input voltage sources.

In an exemplary embodiment, the current summing amplifier circuit 112 may include at least one of a common drain circuit configuration and a common source circuit configuration. In an exemplary embodiment, at least one of the common drain circuit configuration, and the common source circuit configuration may be configured to generate the feed-forward output voltage based on current mirroring the input voltage to the current summing amplifier circuit with the feed-forward output voltage. The second transistor associated with the current summing amplifier circuit 112 may include high input impedance at a gate terminal of the second transistor, and the output node of the current summing amplifier circuit 112 may include low output impedance, enabling the output node of the error amplifier circuit to be buffered from the pass switch transistor 122.

In an exemplary embodiment, the feed-forward stage 104 may include a Dynamic Current Bleeder (DCB) circuit 114 communicatively coupled between an output node of the current summing amplifier circuit 112 and an output node of the linear LDOVR system 100. The DCB circuit 114 may be configured to receive the feed-forward output voltage from the current summing amplifier circuit 112. Further, the DCB circuit 114 may be configured to level-shift the received feed-forward output voltage, by using a gate-source voltage of a third transistor (not shown in FIG. 1) associated with the DCB circuit 114, to generate a level-shifted output voltage. The level-shifted output voltage corresponds to a source voltage of the third transistor. Furthermore, the DCB circuit 114 may be configured to determine via a bleed transistor if the generated level-shifted output voltage is greater than a threshold voltage of the bleed transistor (not shown in FIG. 1) associated with the DCB circuit 114. When the determined level-shifted output voltage is greater than the threshold voltage of the bleed transistor associated with the DCB circuit 114, the bleed transistor may be dynamically switched-on to bleed a current from the output node of the linear LDOVR system 100. Bleeding the current includes reducing a gate voltage of a pass switch transistor 122 connected in parallel to an input node of the DCB circuit 114, and the output node of the DCB circuit 114 and the linear LDOVR system 100. In an exemplary embodiment, reducing the gate voltage of the pass switch transistor is to provide sufficient drain-source voltage headroom to the first transistor associated with the amplification of the filtered version of the received input voltage, to be in a saturation state.

In an exemplary embodiment, the bleed transistor may be sized to minimize a lowest quiescent current drawn by the linear LDOVR system 100 under, but not limited to, a no-load current condition across process, voltage, and temperature (PVT) variations, maintain a pre-determined target power supply rejection (PSR) ratio, and the like.

The DCB circuit 114 may be further configured to sense, via the third transistor, a level-shifted gate voltage of the pass switch transistor 122, when the linear LDOVR system 100 is in, but not limited to, an initial turn on condition, a no-load current condition, a minimal current drawing condition, and the like. Further, the bleed transistor activates, based on the sensed level-shifted gate voltage of the pass switch transistor 122. The bleed transistor may be activated to turn-on the linear LDOVR system 100, by bleeding current to isolate the dominant pole of the linear LDOVR system 100 from a second pole at the output node of the linear LDOVR system 100 of a closed-loop transfer function associated with the linear LDOVR system 100. The transfer function of the linear LDOVR system 100 may usually include two poles, a first pole at the output of the first stage 102 and a second pole at the output of the LDOVR system 100. In the absence of compensation, these two poles are not separated in frequency, thus, some compensation is needed to stabilize the linear LDOVR system 100. Further, the location of the output pole in the linear LDOVR system 100 may be directly proportional to a load current. A typical LDOVR system may be required to support a large dynamic range of load currents, which creates an additional challenge in stabilizing the system. One form of compensation/stabilization of the linear LDOVR system 100 may be based on Miller compensation and involves placing a compensation capacitor (Cc) across the output node of the linear LDOVR system 100. This compensation capacitor Cc may split the two poles, whereby the pole at the output of the first stage 102 may be moved to a lower frequency making it the dominant pole, and the pole at the output node may be moved to a higher frequency, thereby stabilizing the linear LDOVR system 100.

Furthermore, the DCB circuit 114 may be further configured to determine, if at least one load connected to the output node of the linear LDOVR system 100 may be drawing current from the linear LDOVR system 100, during the minimal current drawing condition. Additionally, the DCB circuit 114 may be configured to reduce the gate voltage of the pass switch transistor 122, by a LDO regulation loop. The gate voltage may be reduced to minimize a level-shifted voltage at a source terminal of the third transistor associated with the DCB circuit 114, by a same amount of the minimized gate voltage of the pass switch transistor 122. Further, the bleed transistor may be deactivated for reducing a quiescent current to optimize the load transient response and the line transient response of the linear LDOVR system 100, based on reducing the gate voltage of the pass switch transistor 122.

In an exemplary embodiment, the feed-forward stage 104 may include a Compensation capacitor (Cc) 116. The Cc 116 may be communicatively coupled between the output node of the error amplifier circuit 110 and the output node of the linear LDOVR system 100. The Cc 116 may be configured to create, via a Miller effect, a dominant pole at the output node of the error amplifier circuit 110. The Miller effect refers to the phenomenon, where the input capacitance of a transistor or an electronic component appears to be larger than it actually is due to the voltage gain of the amplifier. Further, the Cc 116 may be configured to optimize a Power Supply Rejection (PSR) response of the linear LDOVR system 100, by using the current summing amplifier circuit 112, and optimize a load transient response and a line transient response of the linear LDOVR system 100, using the boost and reduce amplifier circuit 118 associated with the feed-back stage 106.

In an exemplary embodiment, the feed-back stage 106 may include the boost and reduce amplifier circuit 118 communicatively coupled to the output node of the linear LDOVR system 100. In an exemplary embodiment, the boost and reduce amplifier circuit 118 may correspond to an Alternating Current (AC) feedback amplifier (not shown in FIG. 1). The AC feedback amplifier may include plurality of Metal-Oxide-Semiconductor Field-Effect Transistor (MOSFET), the first capacitor C1, and a second capacitor C2 (not shown in FIG. 1), to reduce the load transient response and the line transient responses of the linear LDOVR system 100.

The boost and reduce amplifier circuit 118 may be configured to sense, via a feedback loop, the output voltage of the linear LDOVR system 100. Based on the sensed output voltage of the linear LDOVR system 100, the boost and reduce amplifier circuit 118 may be configured to detect an event including at least one of a droop signal and a shoot signal via a first capacitor C1 (not shown in FIG. 1) associated with the boost and reduce amplifier circuit 118. Based on detecting the event including at least one of the droop signal and the shoot signal at the output voltage of the linear LDOVR system 100, the boost and reduce amplifier circuit 118 may be configured to amplify and invert the output voltage of the linear LDOVR system 100. In an exemplary embodiment, when the detected event corresponds to the droop signal, the boost and reduce amplifier circuit 118 may be configured to boost a tail current in a tail node of the error amplifier circuit 110, using the amplified and inverted output voltage of the linear LDOVR system 100. In an exemplary embodiment, the amplified and inverted output voltage of the linear LDOVR system 100 may be Alternating Current (AC) coupled via the second capacitor of the boost and reduce amplifier circuit 118, to a gate terminal of a current source-based transistor associated with the boost and reduce amplifier circuit 118.

In an exemplary embodiment, the boost and reduce amplifier circuit 118 may be configured to reduce the tail current in the tail node of the error amplifier circuit 110, when the detected event corresponds to the shoot signal, to decrease a magnitude of at least one of the droop signal and the shoot signal, and for enhancing the load transient response and the line transient response.

In an exemplary embodiment, the feed-back stage 106 may include a resistive divider circuit 120 communicatively coupled to the output node of the linear LDOVR system 100 and an input node of the error amplifier circuit 110. The resistive divider circuit 120 may be configured to generate a divided feedback voltage from the output voltage of the linear LDOVR system 100, to regulate the error amplified signal of the error amplifier circuit 110, using a resistive ratio of the resistive divider circuit 120, corresponding to a feedback factor. In an example, the feedback factor may correspond to how the output voltage of the resistive divider circuit 120 is feed back to the error amplifier circuit 110, influencing the behavior of the linear LDOVR system 100. The feedback factor may often be determined by the resistive ratio. In many cases, the feedback factor is used to regulate the output voltage of a circuit, ensuring stability and desired performance.

In an exemplary embodiment, the second stage 108 may include the pass switch transistor 122. The pass switch transistor 122 may include an input node, which may be communicatively coupled between the output node of the current summing amplifier circuit 112 and the input node of the DCB circuit 114. Further, the pass switch transistor 122 may include an output node, which may be communicatively coupled to the input node of the error amplifier circuit 110. In an exemplary embodiment, the pass switch transistor 122 may be configured to receive a gate voltage associated with the pass switch transistor, based on the feed-forward output voltage from the current summing amplifier circuit. Furthermore, the pass switch transistor 122 may be configured to regulate the output voltage of the linear LDOVR system 100, based on the received gate voltage corresponding to the feed-forward output voltage from the current summing amplifier circuit.

In an exemplary embodiment, the linear LDOVR system 100 may be implemented as a standalone device such as a voltage regulating apparatus or device. In another example, each of the first stage 102, the feed-forward stage 104, the feed-back stage 106, and the second stage 108 may be implemented as a standalone device. In yet another example, the first stage 102, the feed-forward stage 104, the feed-back stage 106, and the second stage 108 may be implemented and integrated into an existing voltage regulating device/apparatus. In yet another example, the sequence of the first stage 102, the feed-forward stage 104, the feed-back stage 106, and the second stage 108 may be interchanged and implemented as a voltage regulating device. In yet another example, the feed-forward stage 104, the feed-back stage 106, may be implemented as a voltage regulator.

Figure 2:
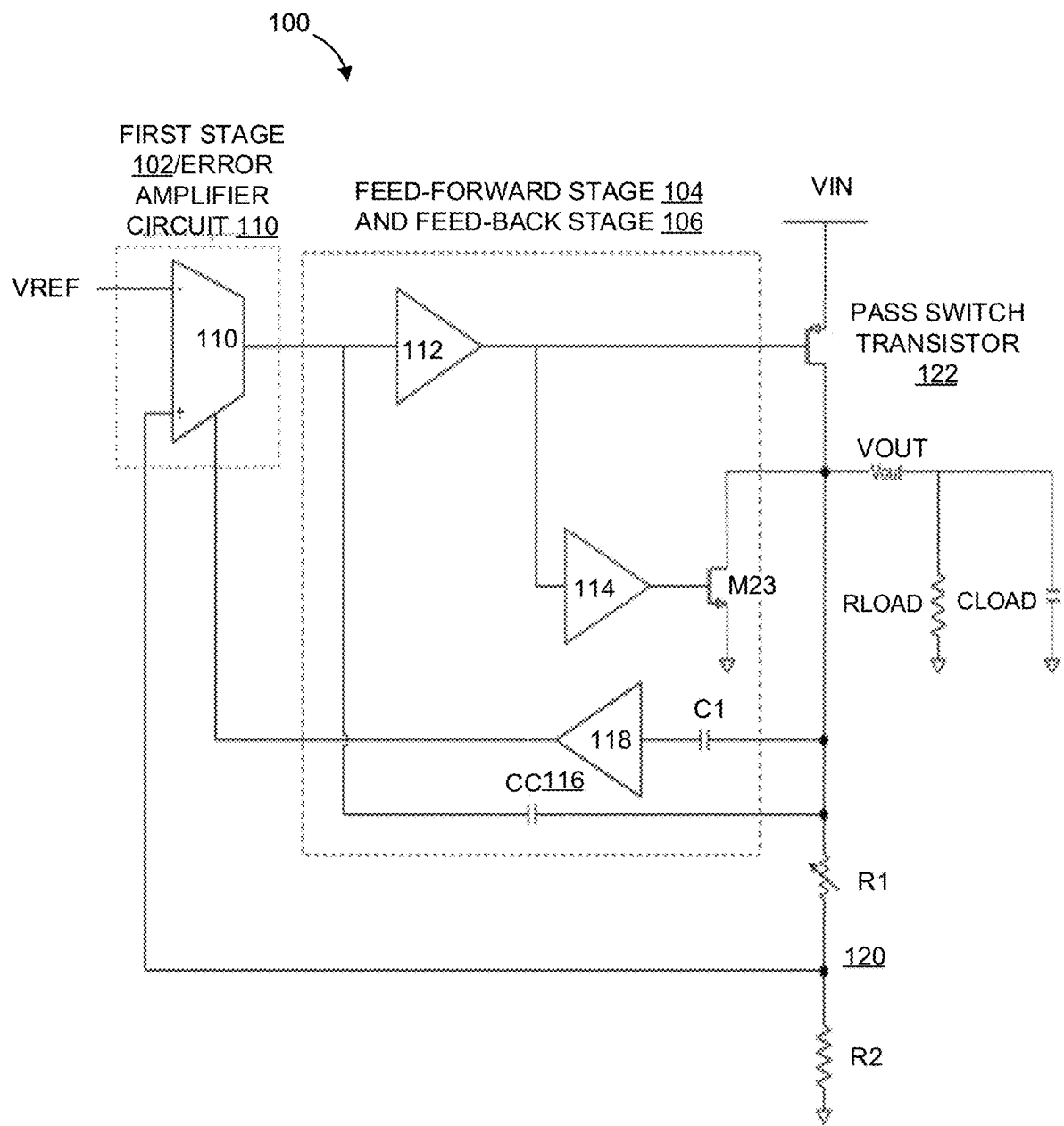
FIG. 2 illustrates an exemplary block diagram representation of detailed circuit components associated with the linear LDOVR system such as those shown in FIG. 1, according to an example embodiment of the present disclosure.
Figure 3:
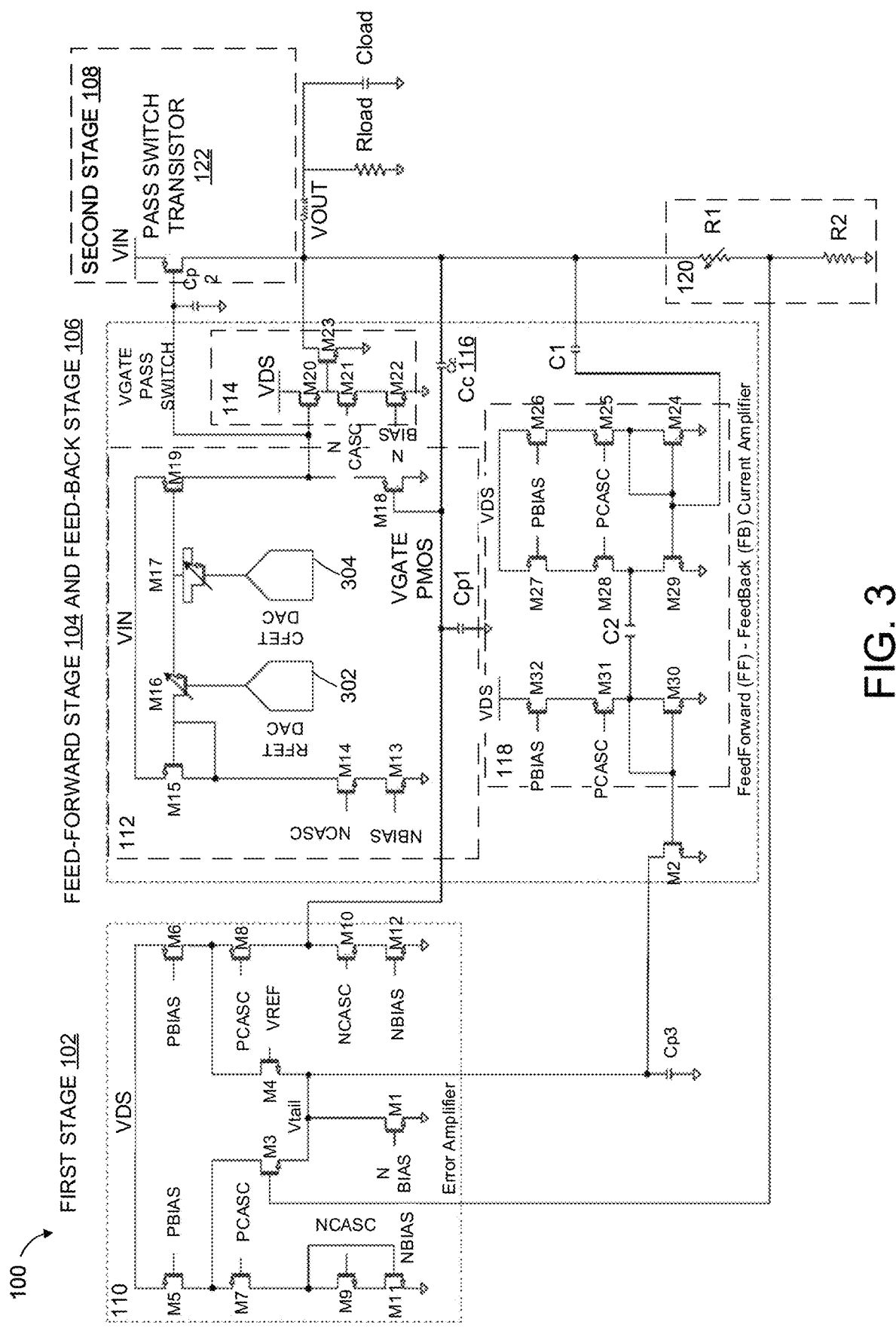
FIG. 3 illustrates an exemplary circuit diagram representation for a transistor-level implementation of the linear LDOVR system such as those shown in FIG. 1, according to an example embodiment of the present disclosure.

The circuit architecture for the linear LDOVR system 100 may include other system elements or components and is not limited to the components shown in FIG. 1. For example, the linear LDOVR system 100 may include op-amps, transistors, resistors, capacitors, amplifiers, loads, circuitries, power supplies, buffers, a processor, and a memory comprising modules. The disclosed technology may be implemented in different ways as shown in FIGS. 1-3, and any other way deemed to be suitable for various applications. The various applications of the linear LDOVR system 100 may include, but not limited to, Artificial Intelligence (AI) based systems, Internet of Things (IoT), medical equipment, Analogue-to-Digital Converter (ADC), Radio Frequency (RF) Application Specific Integrated Circuits (ASICs), automotive, wireless devices, digital-to-analog converter (DAC), mixed-signal ASICs, system on chips (SoCs), aerospace, industrial automation, renewable energy, consumer electronics, power management, telecommunications, instrumentation, military and defense, medical imaging, wearable technology, data centers, network infrastructure, security systems, home automation, audio equipment, video processing, robotics, gaming consoles, embedded systems, lighting systems, and the like, and combination(s) thereof.

It should be appreciated that the circuit architecture of the linear LDOVR system 100 that are depicted in FIGS. 1-3 may be a few example implementations. Hence, the circuit architecture of the linear LDOVR system 100 may or may not include additional features and some of the features described herein may be removed and/or modified without departing from the scope of the circuit architecture of the linear LDOVR system 100 outlined herein. While the circuits, components, elements, systems, subsystems, processors and/or other apparatus/devices may be shown as single components or elements, one of ordinary skill in the art would recognize that these single components or elements may represent multiple components or elements and that these components or elements may be connected via one or more communication techniques.

FIG. 2 illustrates an exemplary block diagram representation of a detailed circuit components associated with the linear LDOVR system 100 such as those shown in FIG. 1, according to an example embodiment of the present disclosure. For example, the error amplifier circuit 110 may compare a reference voltage (e.g., a fixed, stable voltage) with a feedback voltage (i.e., a portion of the output voltage). Differences between the reference voltage and the feedback voltage may be amplified by the error amplifier circuit 110. The amplified difference, such as the error amplified signal (or an error voltage) may dictate one or more adjustments needed to maintain the desired output voltage of the linear LDOVR system 100. In one instance, the reference voltage remains constant, providing a stable reference point for comparison. The error amplifier circuit 110 may continuously monitor the difference between the reference voltage and the feedback voltage. If the output voltage drops (due to increased load current), there is a decrease in the feedback voltage. The error amplifier circuit 110 may detect the decreased feedback voltage and amplifies the feedback voltage into the error amplified signal (e.g., the error voltage). The error amplified signal may be used to adjust the gate voltage of the pass switch transistor 122.

Further, the feed-forward stage 104 and the feed-back stage 106 may include one or more current amplifier circuits.

The feed-forward stage 104 and the feed-back stage 106 may influence both feed-forward and feed-back paths within the linear LDOVR system 100. To overcome voltage spikes or dips during abrupt changes in a load current, the feed-forward stage 104, and the feed-back stage 106 of the linear LDOVR system 100 may anticipate the abrupt changes and adjust the pass switch transistor 122 accordingly to minimize the transient voltage deviations. Further, the feed-forward stage 104 and the feed-back stage 106 may provide additional control over the feedback path, allowing the linear LDOVR system 100 to maintain regulation even under varying operating conditions such as, but not limited to, temperature or input voltage fluctuations, and the like.

In another example, by optimizing the operation of the pass switch transistor 122, based on both feedforward and feedback signals, the feed-forward stage 104 and the feed-back stage 106 may improve overall efficiency and reduce power consumption of the linear LDOVR system 100. In another instance, by slightly opening the pass switch transistor 122 (i.e., decreasing resistance), the linear LDOVR system 100 may allow more current to flow from the input to the output, compensating for the voltage drop and bringing the output voltage back to the desired level. This negative feedback path may ensure the linear LDOVR system 100 to dynamically adjust for maintaining the output voltage despite changes in load current. The effectiveness of regulating the output voltage under varying load current conditions, enable the linear LDOVR system 100 to be suitable for powering a wide range of electronic devices.

FIG. 3 illustrates an exemplary circuit diagram representation for a transistor-level implementation of the linear LDOVR system 100 such as those shown in FIG. 1, according to an example embodiment of the present disclosure. The architecture of the linear LDOVR system 100 may enable enhanced PSR, load and line regulation and alleviate the requirement of a large external capacitor, and in turn reducing the overall cost in a product deployment as one less component may be required. The proposed linear LDOVR system 100 achieves the aforementioned performance metrics due to the addition of the feed-forward stage 104 and the feed-back stage 106 as depicted in FIG. 3. According to FIG. 3, the first stage 102 may include the error amplifier circuit 110. The error amplifier circuit 110 may include transistors M1, M3, M4, M5, M6, M7, M8, M9, M10, M11, and M12. The error amplifier circuit 110 may receive a supply voltage (e.g., Vds) as input voltage via the M5 and the M6 transistor, and the output voltage such as the error amplified signal is provided via the transistor M8 and M10. The error amplifier circuit 110 may be supplied with bias currents/voltages such as N-type BIAS (NBIAS), N-type Cascode (NCASC), P-type BIAS (PBIAS) and P-type Cascode (PCASC). It should be understood for a person skilled in the art, the P-type and/or N-type transistor may be interchanged in the circuit configuration as required. The circuit configuration depicted in FIG. 3 may not be a sole option and serves as an example rather than a limitation.

Further, the feed-forward stage 104 may include the current summing amplifier circuit 112. In an exemplary embodiment, the current summing amplifier circuit 112 may include transistors such as M13, M14, M15 (i.e., the fourth transistor), M16 (i.e., the fifth transistor), M17, and M18 (i.e., the second transistor) and a control Digital-to-Analog Converters (DACs) such as a Resistor Field Effect Transistor (RFET) DAC 302 and a Capacitor FET (CFET) DAC 304. The current summing amplifier circuit 112 may obtain the error amplified signal (i.e., error voltage applied to a gate voltage (Vgate) of a p-channel metal-oxide-semiconductor (PMOS) transistor shown in FIG. 3) generated from the error amplifier circuit 110. Further, the current summing amplifier circuit 112 may level-shift the error amplified signal by the Vgs of the transistor M18 (i.e., the second transistor) whilst adding the level-shifted error amplified signal to an amplified low pass filtered version of the input voltage via a transistor M19 (i.e., the first transistor), to function as a common drain amplifier.

The low pass filtered version of the input voltage is obtained from a low-pass filter associated with the current summing amplifier circuit 112. The low-pass filter may include a RFET, the transistor M16 (i.e., the fifth transistor) and a CFET, the transistor M15 (i.e., the fourth transistor). The gates of the RFET and the CFET may be connected to dedicated control DACs 302 and 304. The DACs enable the PSR of the linear LDOVR system 100 to be adjusted for custom applications and different input voltage sources.

Further, the feed-forward stage 104 may include the Dynamic Current Bleeder (DCB) circuit 114. The DCB circuit 114 may include transistors M20 (i.e., the third transistor), M21, M22, and M23. Further, the DCB circuit 114 may include two key functions such as headroom regulation of a drain-source voltage (Vds) of the transistor M19 in the current summing amplifier circuit 112, and a dynamic no load current behavior. The headroom regulation of the Vds of the transistor M19 in the current summing amplifier circuit 112 may include in which the current bleeder bleeds current from the output voltage (Vout) of the linear LDOVR system 100. The bleeding current may be outside a regulation loop to ensure that the transistor M19 may always be in saturation across process, voltage, and temperature (PVT) variations, in turn ensuring an optimal PSR across the PVT variations.

The optimal PSR may be achieved by obtaining the output voltage of the current summing amplifier circuit 112 (i.e., gate voltage (Vgate) of the pass switch transistor 122) and level shifting the output voltage of the current summing amplifier circuit 112 by a gate voltage (Vgs) of the transistor M20 (i.e., the third transistor). If, the level shifted voltage (i.e., source voltage of the transistor M20) is greater than a threshold voltage (Vth) of the bleed transistor M23, the current summing amplifier circuit 112 may turn on the transistor M23 to bleed current from the output, which in turn lowers gate voltage (Vgate) of the pass switch transistor 122. Lowering the Vgs of the pass switch transistor 122 and turning-on the transistor M23 may supply the transistor M19 enough Vds to be in a saturation mode. In an example, the transistor M23 may be sized to ensure that the linear LDOVR system 100 may draw the lowest quiescent current whilst ensuring the target PSR specification is met.

Further, the dynamic no load current behavior may include in which the DCB circuit 114 may ensures that whenever the linear LDOVR system 100 starts up and has no load current or in the event of no-load or a minimal amount of current being drawn from the linear LDOVR system 100. Further, the DCB circuit 114 may sense the gate voltage (Vgate) of the pass switch transistor 122, and turns-on the bleed transistor M23 which in turns-off the linear LDOVR system 100, to ensure that the first/dominant pole of the linear LDOVR system 100 may be separated from a second pole of the closed loop transfer function of the linear LDOVR system 100. The closed-loop transfer function (H(s)) of the linear LDOVR system 100 may include the relationship between the input voltage (Vin) and the output voltage (Vout) considering the feedback loop's influence. It represents how the LDO regulates the output voltage based on changes in the input voltage. Given the latter, the transistor M23 may be sized accordingly to ensure low quiescent current condition across the PVT variations under no load conditions whilst ensuring stability. Once one or more loads (Rload and/or Cload) connected to the output node of the linear LDOVR system 100 starts drawing current from the linear LDOVR system 100, the gate voltage (Vgate) of the pass switch transistor 122 may be lowered by a LDO regulation loop. This leads to the level shifted voltage at the source of the transistor M20 to be lowered by the same amount, which turns-off the bleed transistor M23, to reduce the quiescent current in a smart and dynamic way whilst maintaining all the key performance specifications of the linear LDOVR system 100. Consider, there may be always a minimal amount current being drawn in a dynamic fashion, this also helps the linear LDOVR system 100 to enhance the load and line regulation responses. The LDO voltage regulator utilizes a closed-loop feedback system to maintain a stable and consistent output voltage (Vout) despite variations in the input voltage (Vin) or load current (Iout).

In an exemplary embodiment, the feed-back stage 106 may include the boost and reduce (B&R) amplifier circuit 118. To enhance the load and transient responses of the linear LDOVR system 100, an Alternating Current (AC) feedback amplifier may be used, which includes transistors M24, M25, M26, M27, M28, M29, M30, M31, M32, and M2, capacitor C1 and capacitor C2. The feedback loop may sense the output voltage of the linear LDOVR system 100 and detects droop or shoot events via the capacitor C1. For example, the droop event signifies a decrease in the output voltage. As the output voltage dips, the voltage across C1 also decreases. A shoot event signifies an increase in the output voltage. As the output voltage spikes, the voltage across C1 also increases. The boost and reduce amplifier circuit 118 is designed to be sensitive to these changes in the voltage across C1.

In the event of a droop or shoot signal at the output of the linear LDOVR system 100, the boost and reduce amplifier circuit 118 or the AC feedback amplifier may obtain the droop or shoot signal. The boost and reduce amplifier circuit 118 or the AC feedback amplifier may amplify and invert the obtained droop or shoot signal. The amplified and inverted signal may be an AC coupled via a capacitor C2 to the gate of the current source transistor M2. The latter mechanism boosts the tail current (vtail node) in the error amplifier circuit 110 in case of a droop event and reduces the current in the event of a shoot event resulting in decreasing the magnitude of droop and shoot events, hence enhancing the load and line transient regulation events.

In an exemplary embodiment, the feed-forward stage 104 may include Compensation capacitor (Cc) 116. The Cc 116 may include a connection between the output node (i.e., the node Vgate PMOS) of the error amplifier circuit 110 and the output node of linear LDOVR system 100. The Cc 116 may then undergo a miller effect leading to creating a dominant pole at the output of the error amplifier circuit 110. In the conventional LDOVRs, a dominant pole may be placed at the output of the conventional LDOVR, which improves the line and load regulation responses of the conventional LDOVR whilst improving the conventional LDOVR. However, to improve the line and load regulation responses of the conventional LDOVR an additional power may be required to increase the bandwidth of the error amplifier circuit and an external off chip capacitor.

The proposed linear LDOVR system 100 may alleviate the need of an external off-chip capacitor, as the pole at the output of the error amplifier circuit 110 may be assigned as the dominant pole. The proposed linear LDOVR system 100 may enhance the PSR by using the current summing amplifier circuit 112. Further, the load and line regulation transient response of the proposed linear LDOVR system 100 may be improved, by using the boost and reduce amplifier circuit 118.

It should be understood for a person skilled in the art, the P-type and/or N-type transistor may be interchanged in the circuit configuration as required. The circuit configuration depicted in FIG. 3 may not be a sole option and serves as an example rather than a limitation.

Exemplary Scenarios 1:

Consider, the linear LDOVR system 100 may incorporate a current-summing amplifier circuit 112 comprised of MOSFETs (M13 to M18) to address the issues associated with the PSR. The current summing amplifier circuit 112 may play a key role in precisely regulating a gate voltage of the pass switch transistor 122. The current summing amplifier circuit 112 combines a fixed current source with the error voltage output from the error amplifier circuit 110. The error amplifier circuit 110 may continuously monitor the difference between the reference voltage and the output voltage of the linear LDOVR system 100. Any discrepancy, generates an error voltage that the current summing amplifier circuit 112 factors-in. The combined control signal allows for more precise and responsive adjustments to the pass switch transistor 122, in turn to enhance the ability of the linear LDOVR system 100 to regulate the output voltage at the output node.

In another example, the linear LDOVR system 100 utilizes MOSFETs within the current summing amplifier circuit 112 instead of passive components such as resistors and capacitors. For example, the MOSFETs may include a smaller footprint on the chip compared to the passive counterparts. This enables a more compact linear LDOVR system 100, ideal for space-constrained applications. Another advantage of MOSFETs is their inherent ability to control their channel resistance and/or capacitance by adjusting their gate voltage. This feature allows for the precise programming of the filtering of the input voltage within the current summing amplifier circuit 112, providing more flexibility in LDO design.

In yet another example, consider, the error amplifier circuit 110 continuously monitors the difference between the reference voltage and the output voltage. Any deviation generates an error voltage that reflects the magnitude and direction of the difference. The error voltage is directed to the current summing amplifier circuit 112. Here, the current summing amplifier circuit 112 is combined with a fixed current source. The fixed current source is typically programmed during the design phase of the linear LDOVR system 100 to meet specific LDO requirements. The combined signal from the error amplifier circuit 110 and the fixed current source creates a control voltage. This control voltage determines the appropriate gate voltage for the pass switch transistor 122. The control voltage modulates the gate voltage of the pass switch transistor 122. By adjusting the gate voltage, the linear LDOVR system 100 effectively controls the resistance of the pass switch, regulating the current flow and consequently, the output voltage.

In an example consider, the linear LDOVR system 100 employs a pass switch transistor 122, typically a PMOS device, to regulate the output voltage. Under light load scenarios, when minimal current is drawn from the output node of the system 100, the regulation loop might decide to shut down the pass switch transistor 122, entirely. This translates to turning off the PMOS transistor, which creates an extremely high resistance path. The combination of extremely high resistance and a load present at the output node may introduce instability within the system 100. In severe cases, this instability can manifest as oscillations in the output voltage. A common technique to address this instability issue involves adding a fixed resistor in parallel with the pass transistor. This fixed resistor guarantees a current path to exist at all times, even under light load conditions. By ensuring some current flow, the PMOS transistor may not completely shut down, thereby maintaining circuit stability. The downside to this approach is wasted quiescent current/power. The fixed resistor continuously consumes extra current, even when the LDOVRs is not supplying required current to the load. This reduces overall efficiency.

The linear LDOVR system 100 may provide a solution to the aforementioned issues using a dynamic current source such as DCB circuit 114. The DCB circuit 114 actively monitors the voltage at the gate of the pass switch transistor 122 (e.g., PMOS). When the gate voltage indicates that no current is flowing (signifying the PMOS is off), a level-shifter circuit steps in. The level-shifter circuit obtains the gate voltage of the pass switch transistor 122 and reduces it by the gate voltage of transistor M20. This creates a small current path through a specifically sized NMOS bleed transistor M23 associated with the DCB circuit 114. The crucial aspect here is that this NMOS transistor is carefully sized and biased to operate just below its threshold voltage. This ensures minimal wasted quiescent current/power. The small current flowing through the NMOS transistor is sufficient to reduce the resistance of the pass switch transistor 122 (e.g., PMOS), preventing the linear LDOVR system 100 from becoming unstable. Hence, the dynamic current source approach avoids unnecessary current consumption compared to the fixed resistor method, improving overall LDO efficiency.

In yet another scenario, a conventional LDOVRs often have a limited PSR at specific frequencies. This means the conventional LDOVRs may not effectively suppress noise from the power supply at certain frequencies. The current summing amplifier circuit 112 incorporates a programmable filter. This allows for adjusting the transfer function of the PSR. By changing the resistance of a PMOS transistor (M16) within the current summing amplifier circuit 112, the frequency response of the PSR may be manipulated. This enables the linear LDOVR system 100 to be optimized for applications with noise at different frequencies. While dynamic calibration of the PSR to adapt to different noise environments is theoretically possible, it is not practical due to the additional power consumption required for such a system. A more practical approach is to pre-program the LDOVRs during manufacturing based on the expected noise environment of the application. However, the possibility of adding a dynamic calibration feature in the future is left open.

In yet another example, the input voltage (VIN) may couple through a parasitic capacitance to a gate terminal of a transistor in the linear LDOVR system 100. Without the RFET (a specific type of transistor), the coupling would cause noise from the power supply to be amplified. The RFET acts as a controlled resistance. By adjusting the gate voltage of the RFET, the channel resistance through the RFET is also adjusted. This creates a filtering effect that cancels out the noise introduced by the parasitic capacitance.

The linear LDOVR system 100 may be designed to handle a wide range of currents, known as a wide-band LDO, can experience diminished Power Supply Rejection (PSR) particularly at minimum current. PSR refers to an ability of the voltage regulator to suppress noise from the power supply itself, ensuring a clean and stable output voltage. This degraded PSR in wide-range LDOs can introduce unwanted noise into the output voltage. In the wide-band LDOs, a larger pass transistor is necessary to accommodate higher currents. Consequently, this can lead to increased parasitic capacitance between the gate and source terminals of the pass switch transistor 122. Parasitic capacitance is a form of unintentional capacitance that exists between components due to the way they are physically laid out on an Integrated Circuit (IC). When there's minimal current draw, the gate voltage of the pass transistor rises. With a large parasitic capacitance, the voltage across the pass transistor (Vds) can become too low, forcing it out of saturation mode. In saturation mode, the pass transistor operates efficiently and provides a stable output voltage. When the transistor falls out of saturation, its efficiency and ability to regulate the output voltage properly are compromised. This can contribute to degraded PSRR. The dynamic current source comes into play again, acting as a savior in this scenario as well. By allowing a small current flow through the NMOS transistor, it helps establish a sufficient Vds across the pass transistor. This keeps the pass transistor in saturation mode and maintains good PSRR even at minimum load conditions, ensuring a clean and reliable output voltage.

In yet another scenario, consider the boost and reduce amplifier circuit 118, for enhancing performance of the linear LDOVR system 100 in load transient events. The load transient event may occur when the current demand on the linear LDOVR system 100 changes rapidly, the output voltage may experience undesirable fluctuations. These fluctuations, manifesting as voltage spikes (overshoots) and dips (undershoots), can disrupt the operation of sensitive electronic components powered by the linear LDOVR system 100. The boost and reduce amplifier circuit 118 addresses this challenge by actively mitigating these voltage transients. The boost and reduce amplifier circuit 118 achieves this through an ingenious design that leverages the following principles. High-frequency signal detection: a capacitor strategically placed at the output node acts as a high-pass filter. This capacitor blocks the steady DC component of the output voltage, allowing only the high-frequency transients (shoots and dips) to pass through. Amplification and inversion: the filtered high-frequency signal is then fed into a common-source amplifier stage. This stage amplifies the transient signal, effectively magnifying the voltage deviations. Additionally, the amplifier inverts the signal, which plays a crucial role in the overall control strategy. Error amplifier modulation: the amplified and inverted transient signal is injected in the form of a current into the error amplifier of the linear LDOVR system 100. This injects a corrective current that influences behavior of the linear LDOVR system 100. Dynamic response enhancement: the impact of the boost and reduce amplifier on the response of the linear LDOVR system 100 to load transients is significant. The impact includes, undershoot correction: when the output voltage dips (undershoot), the injected signal from the boost and reduce amplifier increases the gain of the error amplifier. this prompts the linear LDOVR system 100 to react more aggressively, driving the output voltage back up to the desired level faster. Overshoot prevention: conversely, when the output voltage experiences a spike (overshoot), the injected signal reduces the gain of the error amplifier. This tempers the response of the linear LDOVR system 100, preventing from overcorrecting and causing an excessive voltage to rise.

In yet another example, the linear LDOVR system 100 incorporates a strategically placed Compensation capacitor (Cc) 116 within the error amplifier circuit 110. This leverages the Miller effect to create a dominant pole at the output of the error amplifier circuit 110. This dominant pole guarantees stability regardless of the size of load capacitance implemented at the output of the linear LDOVR system 100, eliminating the need for bulky external capacitors for stability purposes.

Exemplary Scenarios 2:

The linear LDOVR system 100 find applications in regulating on-chip supplies, especially in scenarios such as Artificial Intelligence (AI) based data processing, where workload and power consumption fluctuate. Regulators often struggle to maintain voltage stability under such dynamic conditions, however, the linear LDOVR system 100 provides stable load and line transient responses, making it suitable for applications requiring heavy processing.

The linear LDOVR system 100 provides precise and programmable voltage regulation across a wide range of inputs and outputs. Further, the linear LDOVR system 100 provides key metrics such as the Power Supply Rejection (PSR), line transient, and load transient. The capacitor-less linear LDOVR system 100 may be implemented on, for example, a 12 nm process, and the like. However, as the size of the switch increases to accommodate higher currents, parasitic capacitance becomes a concern. This ripple effect from the input to the output highlights the importance of the regulator design.

In contrast, conventional LDO designs focus on extending the bandwidth of the error amplifier while making the pole present at the output of the LDO dominant. This can result in poor supply rejection and transient responses. To overcome this, feed-forward and feedback current amplifiers are implemented to mitigate these issues. Fundamentally, LDOs regulate the output voltage by comparing it to a reference voltage and adjusting accordingly through negative feedback. The voltage feedback ratio is determined by the resistive ratio of R2 to the sum of R1 and R2, and the reference voltage is typically derived from a bandgap reference, ensuring stability across variations in process voltage and temperature.

Figure 4:
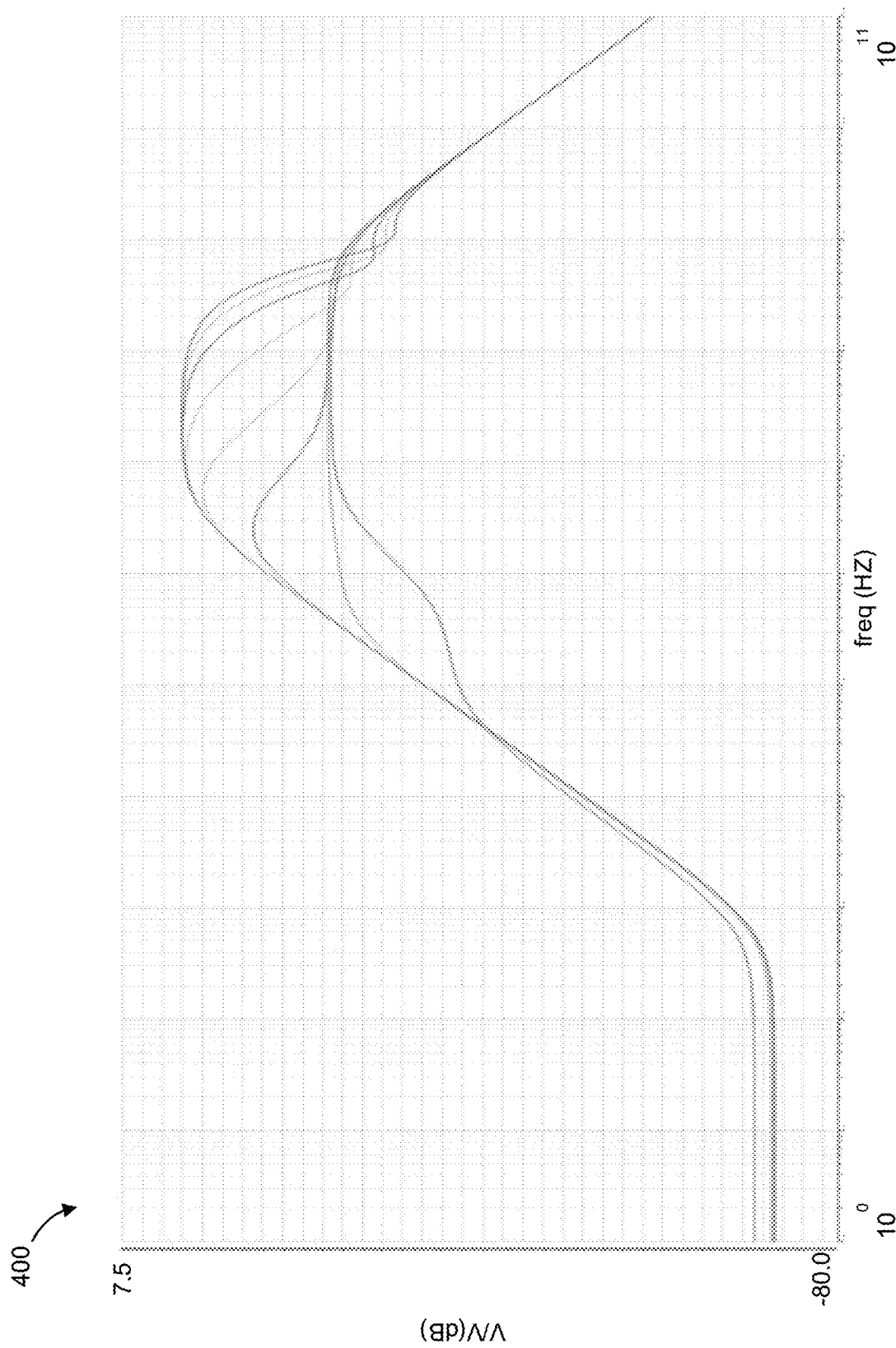
FIG. 4 illustrates an exemplary graph diagram representation of a Power Supply Rejection (PSR) response with a sweep of a Resistor Field Effect Transistor (RFET) comprising a resistive value determined by a RFET control voltage generated by a first Digital-to-Analog Converter (DAC), according to an example embodiment of the present disclosure.
Figure 5:
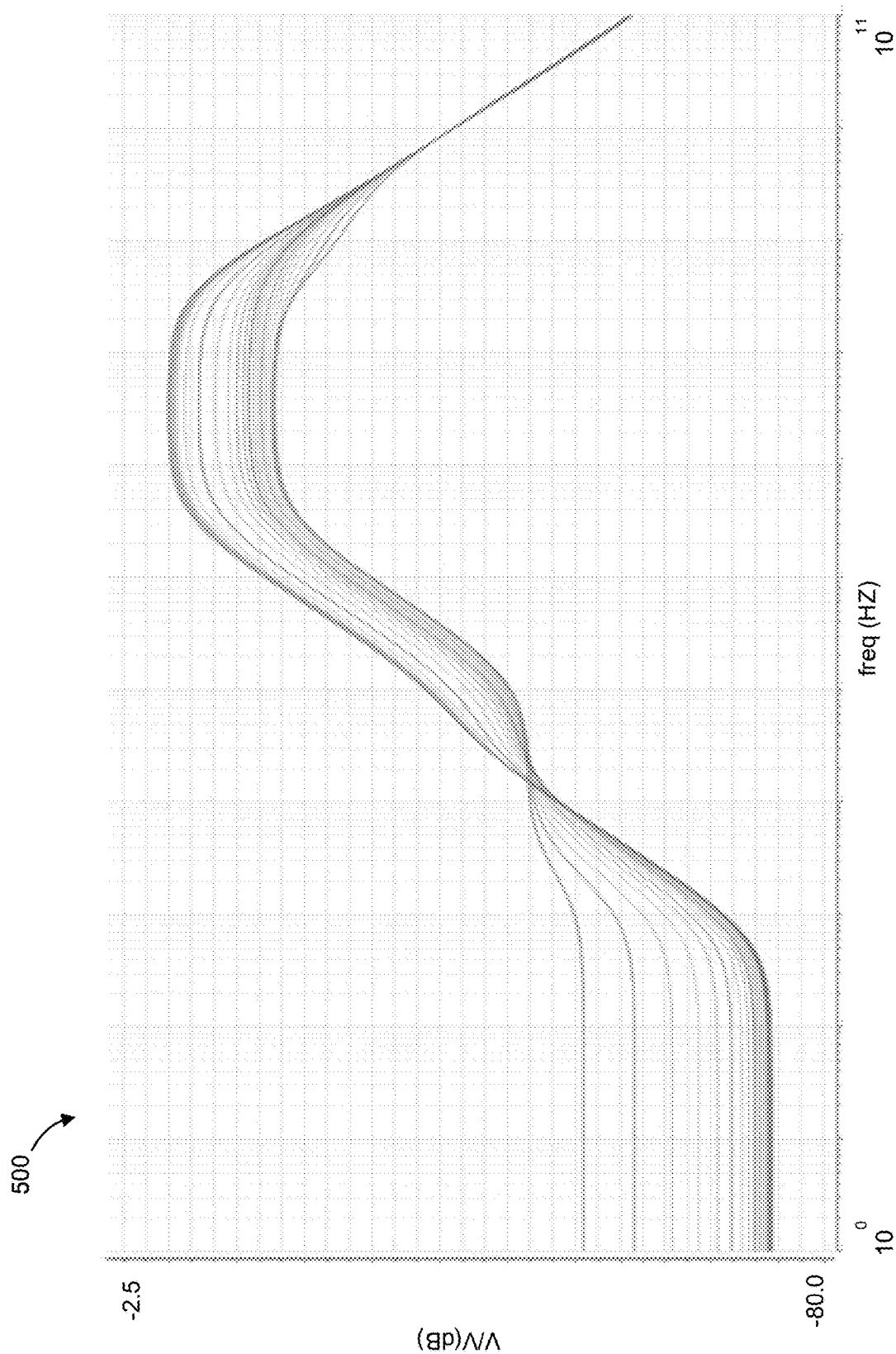
FIG. 5 illustrates an exemplary graph diagram representation of a Power Supply Rejection (PSR) response with a sweep of a Capacitor Field Effect Transistor (CFET) comprising a capacitor value determined by a CFET control voltage generated by a second Digital-to-Analog Converter (DAC), according to an example embodiment of the present disclosure.

FIG. 4 illustrates an exemplary graph diagram representation 400 of a Power Supply Rejection (PSR) response with a sweep of a Resistor Field Effect Transistor (RFET) M16 comprising a resistive value determined by a RFET control voltage generated by a first Digital-to-Analog Converter (DAC) 302, according to an example embodiment of the present disclosure. FIG. 5 illustrates an exemplary graph diagram representation 500 of a Power Supply Rejection (PSR) response with a sweep of a Capacitor Field Effect Transistor (CFET) M17 comprising a capacitor value determined by a CFET control voltage generated by a second Digital-to-Analog Converter (DAC) 304, according to an example embodiment of the present disclosure. It can be observed from FIG. 4 and FIG. 5, that both the Direct Current (DC) and Alternating Current (AC) (high frequency) PSR may be adjusted by means of the RFET DAC 302 (i.e., first DAC 302) and the CFET DAC 304 (i.e., second DAC 304). The latter enables the linear LDOVR system 100 to be deployed into a variety of applications with different input supply ripple specifications.

Figure 6:
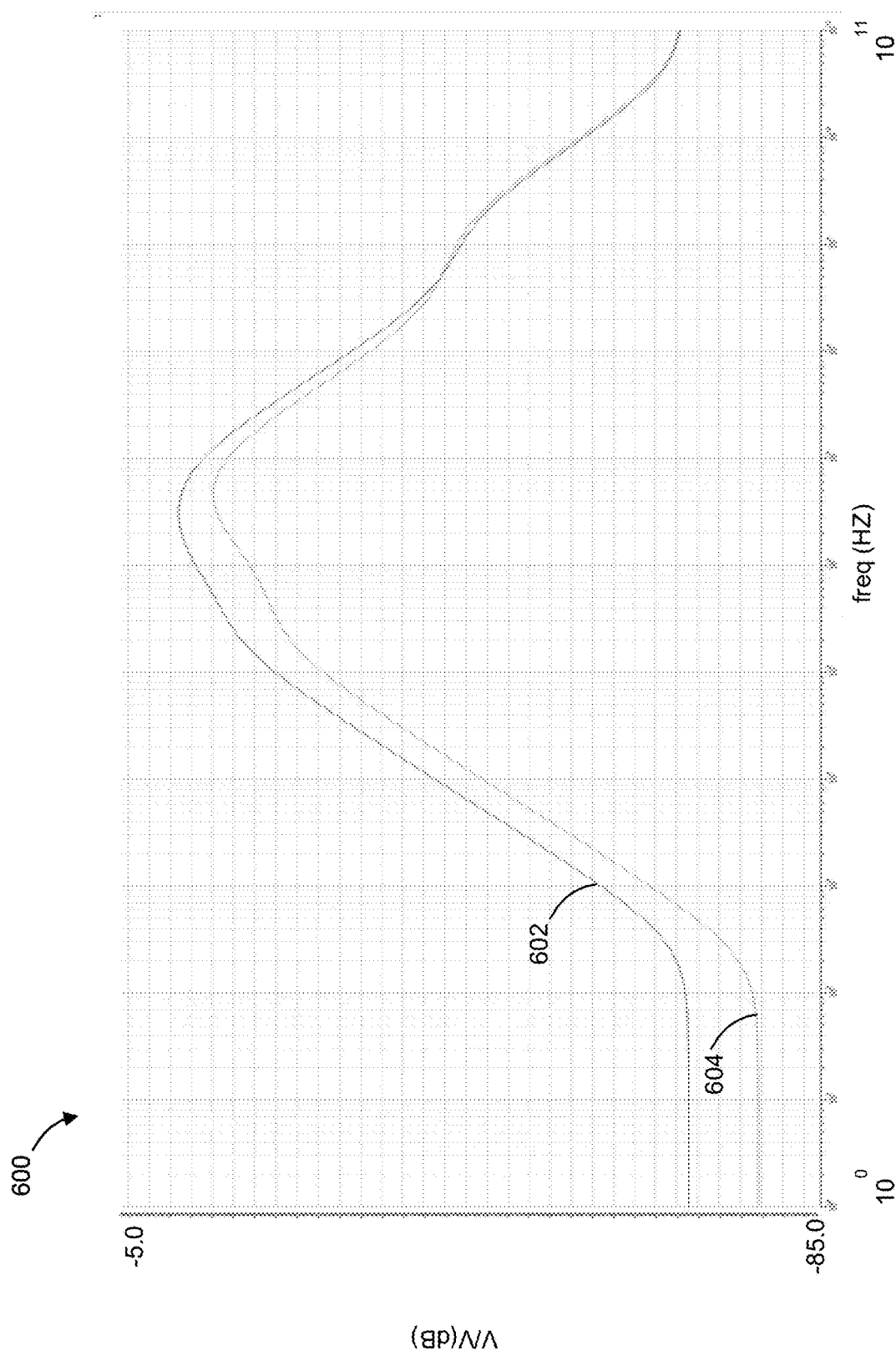
FIG. 6 illustrates an exemplary graph diagram representation of Power Supply Rejection (PSR) responses based on using a Dynamic Current Bleeder (DCB) circuit and without using the DCB circuit in the linear LDOVR system, according to an example embodiment of the present disclosure.

FIG. 6 illustrates an exemplary graph diagram representation 600 of Power Supply Rejection (PSR) responses based on using a Dynamic Current Bleeder (DCB) circuit 114 and without using the DCB circuit 114 in the linear LDOVR system 100, according to an example embodiment of the present disclosure. FIG. 6 depicts the PSR enhancement with the DCB circuit 114. The curve 602 may depict the results of the PSR without using the DCB circuit 114, and the curve 604 may depict the results of the PSR with using the DCB circuit 114.

Figure 7:
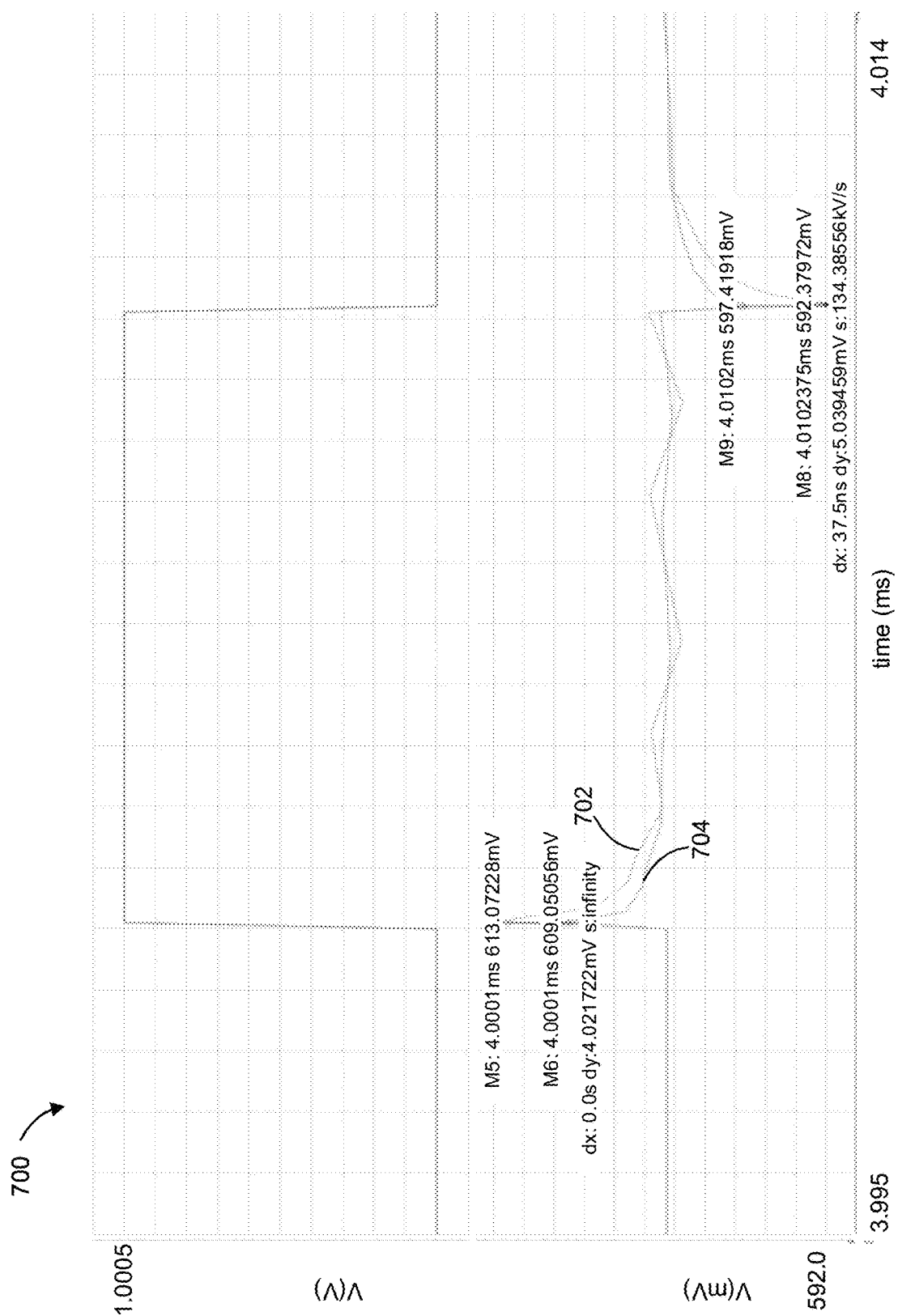
FIG. 7 illustrates an exemplary graph diagram representation of line regulation responses based on using the DCB circuit, and a boost and reduce amplifier circuit and without using the DCB circuit and the boost and reduce amplifier circuit in the linear LDOVR system, according to an example embodiment of the present disclosure.
Figure 8:
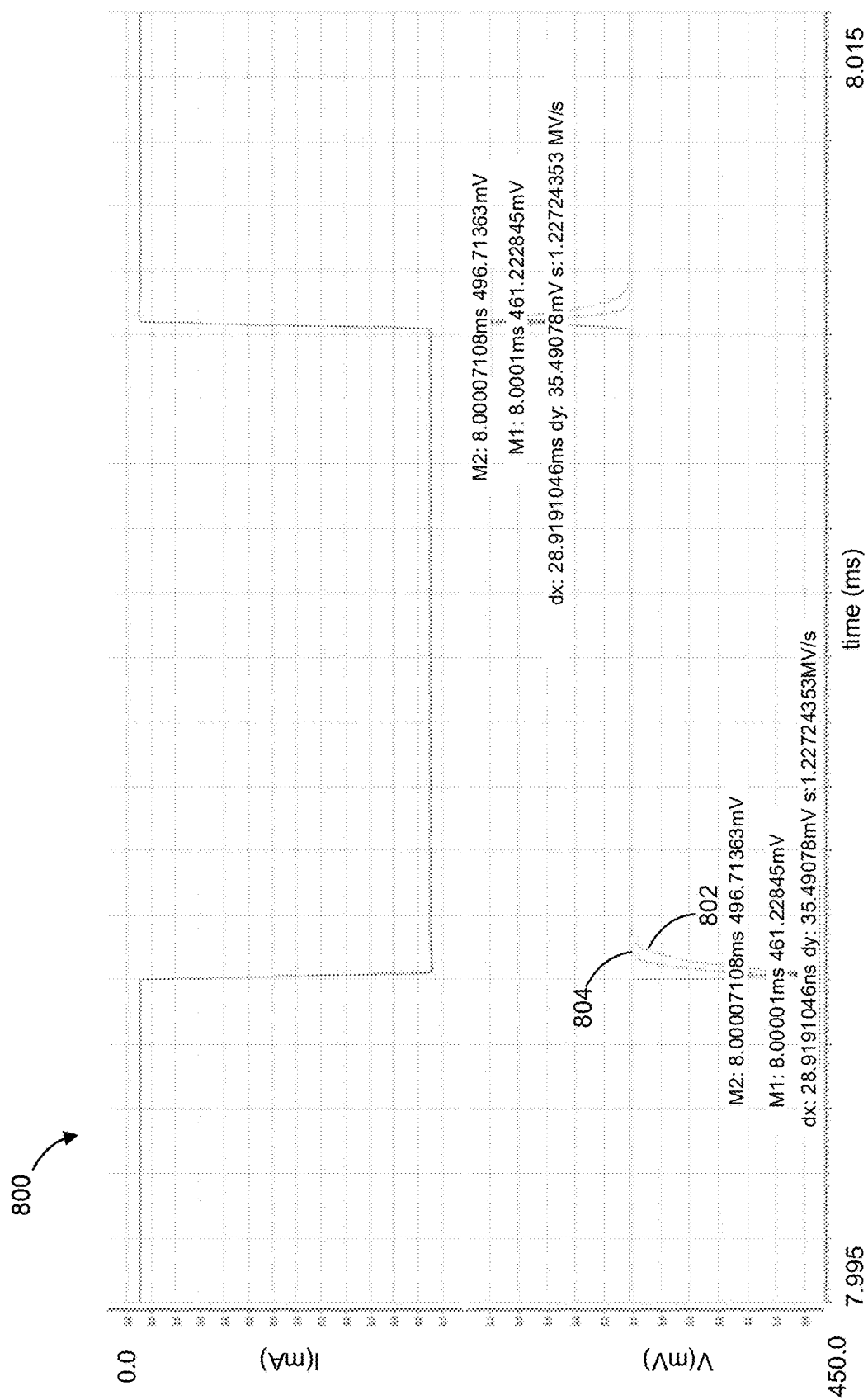
FIG. 8 illustrates an exemplary graph diagram representation of load regulation responses based on using the DCB circuit, and the boost and reduce amplifier circuit and without using the DCB circuit and the boost and reduce amplifier circuit in the linear LDOVR system, according to an example embodiment of the present disclosure.

FIG. 7 illustrates an exemplary graph diagram representation 700 of line regulation responses based on using the DCB circuit 114, and the boost and reduce amplifier circuit 118 and without using the DCB circuit 114 and the boost and reduce amplifier circuit 118 in the linear LDOVR system 100, according to an example embodiment of the present disclosure. FIG. 8 illustrates an exemplary graph diagram representation 800 of load regulation responses based on using the DCB circuit 114, and the boost and reduce amplifier circuit 118 and without using the DCB circuit 114 and the boost and reduce amplifier circuit 118 in the linear LDOVR system 100, according to an example embodiment of the present disclosure. FIG. 7 and FIG. 8 depict the enhanced load and line responses with and without the DCB circuit 114 and the boost and reduce amplifier circuit 118. The response curves 702 in graph 700 and 802 in graph 800 depict results of without using the DCB circuit 114 and the boost and reduce amplifier circuit 118, whilst the response curves 704 in graph 700 and 804 in graph 800 depict the enhanced responses with using the DCB circuit 114 and the boost and reduce amplifier circuit 118.

Figure 9A:
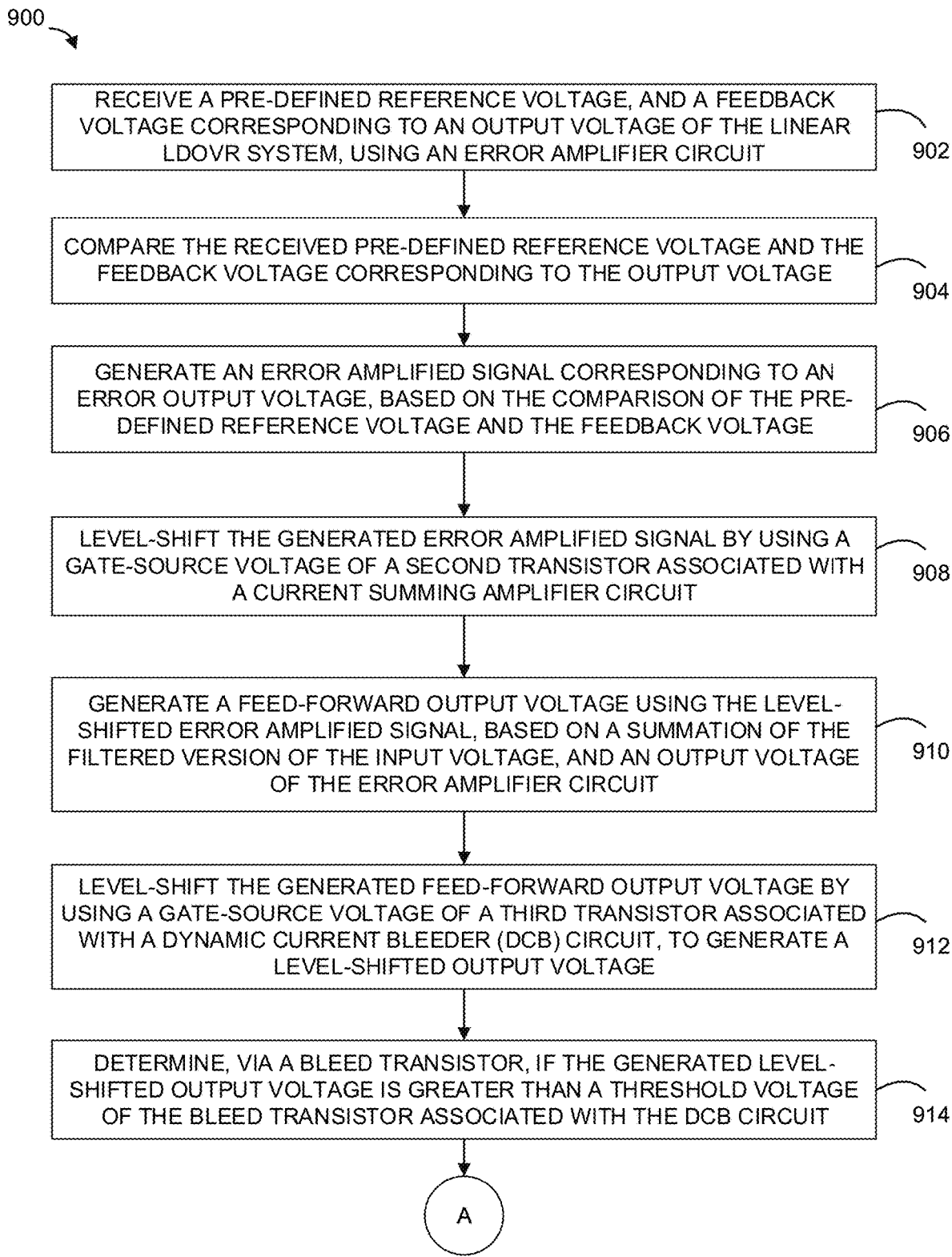
FIGS. 9A, 9B, and 9C illustrate an exemplary flow diagram representation of a linear Low Drop Out (LDO) Voltage Regulating (VR) method, according to an example embodiment of the present disclosure.
Figure 9B:
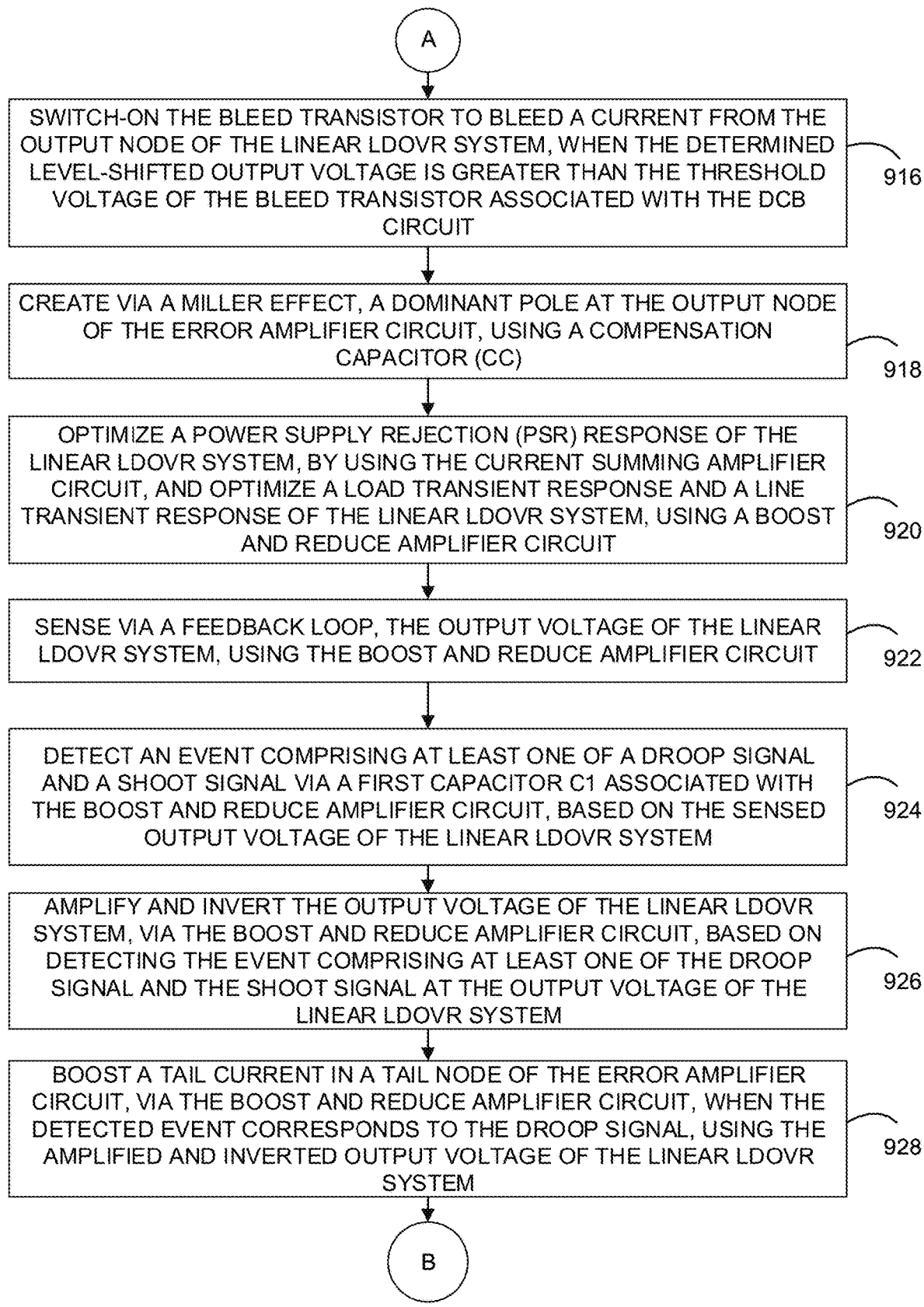
Figure 9C:
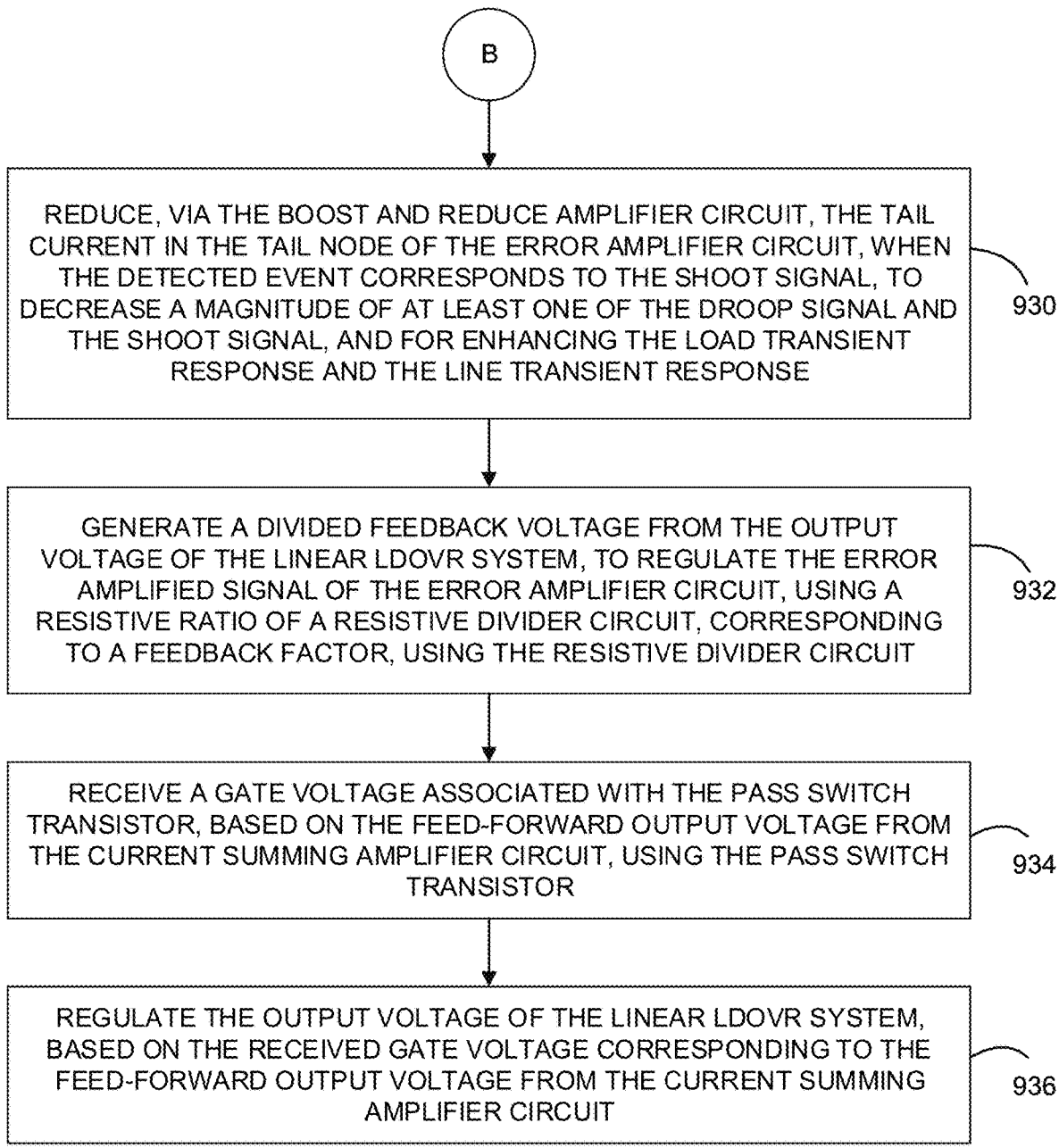

FIGS. 9A, 9B, and 9C illustrate a flow diagram representation of a linear Low Drop Out (LDO) Voltage Regulating (VR) method 900, according to an example embodiment of the present disclosure. FIGS. 9A-9C illustrate a single flow diagram of method 900.

The disclosed method 900 may be performed by one or more components of the system 100 disclosed herein. For example, with reference to FIG. 1 and FIG. 3, the steps disclosed herein may be performed by the, the first stage 102, the feed-forward stage 104, the feed-back stage 106, and the second stage 108. In yet another example, some of the steps disclosed herein may be performed by the error amplifier circuit 110, the current summing amplifier circuit 112, the Dynamic Current Bleeder (DCB) circuit 114, the Compensation capacitor (Cc) 116, the boost and reduce amplifier circuit 118, the resistive divider circuit 120, and the pass switch transistor 122.

As shown in FIG. 9A, at step 902, the method 900 may include receiving, by LDOVR system 100, a pre-defined reference voltage, and a feedback voltage corresponding to an output voltage of the linear LDOVR system 100, using the error amplifier circuit 110.

At step 904, the method 900 may include comparing, by the linear LDOVR system 100, the received pre-defined reference voltage and the feedback voltage corresponding to the output voltage.

At step 906, the method 900 may include generating, by the linear LDOVR system 100, an error amplified signal corresponding to an error output voltage, based on the comparison of the pre-defined reference voltage and the feedback voltage.

At step 908, the method 900 may include level-shifting, by the linear LDOVR system 100, the generated error amplified signal by using a gate-source voltage of a second transistor associated with the current summing amplifier circuit 112. The current summing amplifier circuit 112 receives input voltage via an input terminal, and the input voltage is passed through a low-pass filter to remove at least one of a high-frequency noise and an interference, and generate a filtered version of the received input voltage. The filtered version of the received input voltage may be amplified using the first transistor associated with the current summing amplifier circuit 112, to generate an amplified version of the filtered input voltage.

At step 910, the method 900 may include generating, by the linear LDOVR system 100, a feed-forward output voltage using the level-shifted error amplified signal, based on a summation of the filtered version of the input voltage, and an output voltage of the error amplifier circuit 110.

At step 912, the method 900 may include level-shifting, by the linear LDOVR system 100, the generated feed-forward output voltage by using a gate-source voltage of a third transistor associated with the DCB circuit 114, to generate a level-shifted output voltage. The level-shifted output voltage corresponds to a source voltage of the third transistor.

At step 914, the method 900 may include determining, by the linear LDOVR system 100, via a bleed transistor, if the generated level-shifted output voltage is greater than a threshold voltage of the bleed transistor associated with the DCB circuit 114.

As shown in FIG. 9B, at step 916, the method 900 may include switching-on, by the linear LDOVR system 100, the bleed transistor to bleed a current from the output node of the linear LDOVR system 100, when the determined level-shifted output voltage is greater than the threshold voltage of the bleed transistor associated with the DCB circuit 114. Bleeding the current includes reducing a gate voltage of a pass switch transistor connected in parallel to an input node of the DCB circuit 114, and the output node of the DCB circuit 114 and the linear LDOVR system 100.

At step 918, the method 900 may include creating, by the linear LDOVR system 100, via a miller effect, a dominant pole at the output node of the error amplifier circuit 110, using the Compensation capacitor (Cc) 116.

At step 920, the method 900 may include optimizing, by the linear LDOVR system 100, a Power Supply Rejection (PSR) response of the linear LDOVR system 100, by using the current summing amplifier circuit 112, and optimize a load transient response and a line transient response of the linear LDOVR system 100, using the boost and reduce amplifier circuit 118.

At step 922, the method 900 may include sensing, by the linear LDOVR system 100, via a feedback loop, the output voltage of the linear LDOVR system 100, using the boost and reduce amplifier circuit 118.

At step 924, the method 900 may include detecting, by the linear LDOVR system 100, an event comprising at least one of a droop signal and a shoot signal via a first capacitor C1 associated with the boost and reduce amplifier circuit 118, based on the sensed output voltage of the linear LDOVR system 100.

At step 926, the method 900 may include amplifying and inverting, by the linear LDOVR system 100, via the boost and reduce amplifier circuit 118, the output voltage of the linear LDOVR system 100, based on detecting the event comprising at least one of the droop signal and the shoot signal at the output voltage of the linear LDOVR system 100.

At step 928, the method 900 may include boosting, by the linear LDOVR system 100, a tail current in a tail node of the error amplifier circuit 110, via the boost and reduce amplifier circuit 118, when the detected event corresponds to the droop signal, using the amplified and inverted output voltage of the linear LDOVR system 100.

As shown in FIG. 9C, at step 930, the method 900 may include reducing, by the linear LDOVR system 100, via the boost and reduce amplifier circuit 118, the tail current in the tail node of the error amplifier circuit 110, when the detected event corresponds to the shoot signal, to decrease a magnitude of at least one of the droop signal and the shoot signal, and for enhancing the load transient response and the line transient response.

At step 932, the method 900 may include generating, by the linear LDOVR system 100, a divided feedback voltage from the output voltage of the linear LDOVR system 100, to regulate the error amplified signal of the error amplifier circuit 110, using a resistive ratio of the resistive divider circuit 120, corresponding to a feedback factor, using the resistive divider circuit 120.

At step 934, the method 900 may include receiving, by the linear LDOVR system 100, a gate voltage associated with the pass switch transistor, based on the feed-forward output voltage from the current summing amplifier circuit, using the pass switch transistor 122.

At step 936, the method 900 may include regulating, by the linear LDOVR system 100, the output voltage of the linear LDOVR system 100, based on the received gate voltage corresponding to the feed-forward output voltage from the current summing amplifier circuit.

The order in which the method 900 is described is not intended to be construed as a limitation, and any number of the described method blocks may be combined or otherwise performed in any order to implement the method 900 or an alternate method. Additionally, individual blocks may be deleted from the method 900 without departing from the spirit and scope of the ongoing description. Furthermore, the method 900 may be implemented in any suitable hardware, software, firmware, or a combination thereof, that exists in the related art or that is later developed. The method 900 describes, without limitation, the implementation of the linear LDOVR system 100. A person of skill in the art will understand that method 900 may be modified appropriately for implementation in various manners without departing from the scope and spirit of the ongoing description.

Various examples of the present disclosure provide a capacitor-less linear Low Drop Out (LDO) Voltage Regulating (VR) system and method with enhanced Power Supply Rejection (PSR), line transient response, and load transient response. The linear LDOVR system integrates a current-summing amplifier circuit, leading to significant improvements in Power Supply Rejection (PSR), line and load transient response, and overall efficiency. The linear LDOVR system tackles the PSR challenges head-on by utilizing the current-summing amplifier. The addition of the current-summing amplifier circuit prevents a specific internal component from dominating behavior of the linear LDOVR system. As a result, the linear LDOVR system boasts enhanced PSR. The design effectively responds to fluctuations in the input power supply, leading to a cleaner and more stable output voltage for loads/devices. Additionally, the precise control over a key component allows the LDO to handle sudden changes in output load current with minimal voltage variations, ensuring consistent performance even during load transients. The improved PSR and the line and load transient response of the linear LDOVR system reduces capacitor requirements. Smaller capacitors may be used, leading to a more compact LDO circuit. Additionally, the dynamic current source circuit within the linear LDOVR system provides advantages over traditional methods. The dynamic current bleeder circuit achieves stability while consuming minimal power, resulting in a more efficient LDO overall. The dynamic current bleeder circuit also plays a crucial role in maintaining good PSR in wide-range LDOs.

This translates to a cleaner and more stable output voltage, critical for powering sensitive electronic components.

Further, the implementation of a boost and reduce amplifier circuit actively mitigates voltage spikes and dips during load transients, ensuring a cleaner and more stable output voltage. The corrective action by the boost and reduce amplifier leads to a swifter recovery of the output voltage of the linear LDOVR system, after a transient event. Digital circuits are particularly sensitive to voltage fluctuations, however, the boost and reduce amplifier circuit safeguards the digital circuits by delivering a more stable and predictable voltage supply. The linear LDOVR system achieves improved load and line regulation, tunable PSR, inherent stability, minimized quiescent current, and potentially capacitorless operation. The linear LDOVR system may be ideal for powering sensitive digital circuits and applications requiring a highly regulated voltage supply.

One of ordinary skill in the art will appreciate that techniques consistent with the ongoing description are applicable in other contexts as well without departing from the scope of the ongoing description.

As mentioned above, what is shown and described with respect to the systems and methods above are illustrative. While examples described herein are directed to configurations as shown, it should be appreciated that any of the components described or mentioned herein may be altered, changed, replaced, or modified, in size, shape, and numbers, or material, depending on application or use case, and adjusted for managing handoff.

It should also be appreciated that the systems and methods, as described herein, may also include, or communicate with other components not shown. For example, these may include external processors, counters, analyzers, computing devices, and other measuring devices or systems. This may also include middleware (not shown) as well. The middleware may include software hosted by one or more servers or devices. Furthermore, it should be appreciated that some of the middleware or servers may or may not be needed to achieve functionality. Other types of servers, middleware, systems, platforms, and applications not shown may also be provided at the back end to facilitate the features and functionalities of the testing and measurement system.

Moreover, single components may be provided as multiple components, and vice versa, to perform the functions and features described herein. It should be appreciated that the components of the system described herein may operate in partial or full capacity, or it may be removed entirely. It should also be appreciated that analytics and processing techniques described herein with respect to the optical measurements, for example, may also be performed partially or in full by other various components of the overall system.

It should be appreciated that data stores may also be provided to the apparatuses, systems, and methods described herein, and may include volatile and/or non-volatile data storage that may store data and software or firmware including machine-readable instructions. The software or firmware may include subroutines or applications that perform the functions of the measurement system and/or run one or more application that utilize data from the measurement or other communicatively coupled system.

The various components, circuits, elements, components, and interfaces may be any number of mechanical, electrical, hardware, network, or software components, circuits, elements, and interfaces that serves to facilitate communication, exchange, and analysis data between any number of or combination of equipment, protocol layers, or applications. For example, the components described herein may each include a network or communication interface to communicate with other servers, devices, components or network elements via a network or other communication protocol.

Although examples are directed to satellite communication systems, such as GEO and LEO satellite network systems, it should be appreciated that the systems and methods described herein may also be used in other various systems and other implementations. For example, these may include other various telecommunication test and measurement systems. In fact, there may be numerous applications in cable or optical communication networks, not to mention fiber sensor systems that could employ the systems and methods as well.

What has been described and illustrated herein are examples of the implementation along with some variations. The terms, descriptions, and figures used herein are set forth by way of illustration only and are not meant as limitations. Many variations are possible within the scope of the implementations, which is intended to be defined by the following claims—and their equivalents—in which all terms are meant in their broadest reasonable sense unless otherwise indicated.

The invention claimed is:

1. A linear Low Drop Out (LDO) Voltage Regulating (VR) system comprising:
   a first stage comprising an error amplifier circuit configured to:
      receive a pre-defined reference voltage, and a feedback voltage corresponding to an output voltage of a linear Low Drop Out (LDO) Voltage Regulating (VR) system;
      compare the received pre-defined reference voltage and the feedback voltage corresponding to the output voltage; and
      generate an error amplified signal corresponding to an error output voltage, based on the comparison of the pre-defined reference voltage and the feedback voltage;
   a feed-forward stage comprising:
      a current summing amplifier circuit communicatively coupled to an output node of the error amplifier circuit, wherein the current summing amplifier circuit is configured to:
         receive the error amplified signal from the error amplifier circuit, and an input voltage via an input terminal of the current summing amplifier circuit, wherein the received input voltage is passed through a low-pass filter to remove at least one of a high-frequency noise and an interference, and generate a filtered version of the received input voltage, and wherein the filtered version of the received input voltage is amplified using a first transistor associated with the current summing amplifier circuit, to generate an amplified version of the filtered input voltage, wherein the input voltage via the input terminal is connected to a source of one or more transistors of the current summing amplifier, and parasitically coupled to a gate of the first transistor;
         level-shift the received error amplified signal by using a gate-source voltage of a second transistor associated with the current summing amplifier circuit; and
         generate a feed-forward output voltage using the level-shifted error amplified signal, based on a summation of the filtered version of the input voltage, and an output voltage of the error amplifier circuit;

a Dynamic Current Bleeder (DCB) circuit communicatively coupled between an output node of the current summing amplifier circuit and an output node of the linear LDOVR system, wherein the DCB circuit is configured to:
- receive the feed-forward output voltage from the current summing amplifier circuit;
- level-shift the received feed-forward output voltage by using a gate-source voltage of a third transistor associated with the DCB circuit, to generate a level-shifted output voltage, wherein the level-shifted output voltage corresponds to a source voltage of the third transistor;
- determine, via a bleed transistor, if the generated level-shifted output voltage is greater than a threshold voltage of the bleed transistor associated with the DCB circuit; and
- switch-on dynamically, the bleed transistor to bleed a current from the output node of the linear LDOVR system, when the determined level-shifted output voltage is greater than the threshold voltage of the bleed transistor associated with the DCB circuit, wherein bleeding the current comprises reducing a gate voltage of a pass switch transistor connected in parallel to an input node of the DCB circuit, and the output node of the DCB circuit and the linear LDOVR system; and a Compensation capacitor (Cc) communicatively coupled between the output node of the error amplifier circuit and the output node of the linear LDOVR system, wherein the Cc is configured to:
- create, via a miller effect, a dominant pole at the output node of the error amplifier circuit; and
- optimize a Power Supply Rejection (PSR) response of the linear LDOVR system, by using the current summing amplifier circuit, and optimize a load transient response and a line transient response of the linear LDOVR system, using a boost and reduce amplifier circuit;

a feed-back stage comprising:
the boost and reduce amplifier circuit communicatively coupled to the output node of the linear LDOVR system, wherein the boost and reduce amplifier circuit is configured to:
- sense, via a feedback loop, the output voltage of the linear LDOVR system;
- detect an event comprising at least one of a droop signal and a shoot signal via a first capacitor C1 associated with the boost and reduce amplifier circuit, based on the sensed output voltage of the linear LDOVR system;
- amplify and invert the output voltage of the linear LDOVR system, based on detecting the event comprising at least one of the droop signal and the shoot signal at the output voltage of the linear LDOVR system;
- boost a tail current in a tail node of the error amplifier circuit, when the detected event corresponds to the droop signal, using the amplified and inverted output voltage of the linear LDOVR system; and
- reduce the tail current in the tail node of the error amplifier circuit, when the detected event corresponds to the shoot signal, to decrease a magnitude of at least one of the droop signal and the shoot signal, and for enhancing the load transient response and the line transient response;

a resistive divider circuit communicatively coupled to the output node of the linear LDOVR system and an input node of the error amplifier circuit, wherein the resistive divider circuit is configured to:
- generate a divided feedback voltage from the output voltage of the linear LDOVR system, to regulate the error amplified signal of the error amplifier circuit, using a resistive ratio of the resistive divider circuit, corresponding to a feedback factor; and a second stage comprising the pass switch transistor, wherein the pass switch transistor comprising an input node is communicatively coupled between the output node of the current summing amplifier circuit and the input node of the DCB circuit, and an output node of the pass switch transistor is communicatively coupled to the input node of the error amplifier circuit, wherein the pass switch transistor is configured to:
- receive the gate voltage associated with the pass switch transistor, based on the feed-forward output voltage from the current summing amplifier circuit; and
- regulate the output voltage of the linear LDOVR system, based on the received gate voltage corresponding to the feed-forward output voltage from the current summing amplifier circuit.

2. The linear LDOVR system of claim 1, wherein the DCB circuit is further configured to:
- sense, via the third transistor, a level-shifted gate voltage of the pass switch transistor, when the linear LDOVR system is in at least one of an initial turn on condition, a no-load current condition, and a minimal current drawing condition;
- activate the bleed transistor, based on the sensed level-shifted gate voltage of the pass switch transistor, for turning on the linear LDOVR system, by bleeding current to isolate the dominant pole of the linear LDOVR system from a second pole at the output node of the LDOVR system of a closed-loop transfer function associated with the linear LDOVR system;
- determine, if at least one load connected to the output node of the linear LDOVR system is drawing current from the linear LDOVR system, during the minimal current drawing condition;
- reduce the gate voltage of the pass switch transistor, by a LDO regulation loop, for minimizing a level-shifted voltage at a source terminal of the third transistor associated with the DCB circuit by a same amount of the minimized gate voltage of the pass switch transistor; and
- deactivate the bleed transistor for reducing a quiescent current to optimize the load transient response and the line transient response of the linear LDOVR system, based on reducing the gate voltage of the pass switch transistor.

3. The linear LDOVR system of claim 1, wherein the current summing amplifier circuit is further configured to:
- adjust at least one of a Direct Current (DC) Power Supply Rejection (PSR) and an Alternating Current (AC) high frequency Power Supply Rejection (PSR) via at least one of a Resistor Field Effect Transistor (RFET) comprising a resistive value determined by a RFET control voltage generated by a first Digital-to-Analog Converter (DAC) and a Capacitor FET (CFET) comprising a capacitor value determined by a CFET control voltage generated by a second DAC; and wherein the RFET and the CFET are configured to:
adjust a Power Supply Rejection (PSR) associated with the linear LDOVR system, based on a plurality of applications and a plurality of input voltage sources.

4. The linear LDOVR system of claim 1, wherein the current summing amplifier circuit comprises at least one of a common drain circuit configuration and a common source circuit configuration.

5. The linear LDOVR system of claim 4, wherein at least one of the common drain circuit configuration, and the common source circuit configuration are configured to:
generate the feed-forward output voltage based on current mirroring the input voltage to the current summing amplifier circuit with the feed-forward output voltage, wherein the second transistor associated with the current summing amplifier circuit comprises high input impedance at a gate terminal of the second transistor, and the output node of the current summing amplifier circuit comprises low output impedance, enabling the output node of the error amplifier circuit to be buffered from the pass switch transistor.

6. The linear LDOVR system of claim 1, wherein the low-pass filter comprises a Resistor Field Effect Transistor (RFET) comprising a resistive value determined by a RFET control voltage generated by a first Digital-to-Analog Converter (DAC) and a Capacitor FET (CFET) comprising a capacitor value determined by a CFET control voltage generated by a second DAC, a fourth transistor, and a fifth transistor.

7. The linear LDOVR system of claim 6, wherein the fourth transistor is configured to function as a resistor, wherein the fourth transistor is configured to provide a resistive element in combination with a plurality of components to create a low pass filtering effect, wherein the first DAC connected to the gate terminal of the fourth transistor is configured to adjust a resistance value of the fourth transistor, to modify a cut-off frequency of the low-pass filter.

8. The linear LDOVR system of claim 6, wherein the fifth transistor is configured to function as a capacitor, wherein the function of the fifth transistor in the low-pass filter is to provide the capacitive element in combination with a plurality of components necessary for the low-pass filter, and wherein the second DAC connected to the gate terminal of the fifth transistor is configured to adjust a capacitance value of the fifth transistor, to modify a frequency response of the low-pass filter.

9. The linear LDOVR system of claim 1, wherein reducing the gate voltage of the pass switch transistor is to provide sufficient drain-source voltage headroom to the first transistor associated with the amplification of the filtered version of the received input voltage, to be in a saturation state.

10. The linear LDOVR system of claim 1, wherein the bleed transistor is sized to minimize a lowest quiescent current drawn by the linear LDOVR system under a no-load current condition across process, voltage, and temperature (PVT) variations, and maintain a pre-determined target power supply rejection (PSR) ratio.

11. The linear LDOVR system of claim 1, wherein the boost and reduce amplifier circuit corresponds to an Alternating Current (AC) feedback amplifier comprising a plurality of Metal-Oxide-Semiconductor Field-Effect Transistor (MOSFET), the first capacitor C1, and a second capacitor C2, to reduce the load transient response and the line transient responses of the linear LDOVR system.

12. The linear LDOVR system of claim 1, wherein the amplified and inverted output voltage of the linear LDOVR system is Alternating Current (AC) coupled via a second capacitor of the boost and reduce amplifier circuit to a gate terminal of a current source-based transistor associated with the boost and reduce amplifier circuit.

13. A linear Low Drop Out (LDO) Voltage Regulating (VR) method comprising:
receiving, by a linear Low Drop Out (LDO) Voltage Regulating (VR) system, a pre-defined reference voltage, and a feedback voltage corresponding to an output voltage of the linear LDOVR system, using an error amplifier circuit;
comparing, by the linear LDOVR system, the received pre-defined reference voltage and the feedback voltage corresponding to the output voltage; and
generating, by the linear LDOVR system, an error amplified signal corresponding to an error output voltage, based on the comparison of the pre-defined reference voltage and the feedback voltage;
level-shifting, by the linear LDOVR system, the generated error amplified signal by using a gate-source voltage of a second transistor associated with a current summing amplifier circuit, wherein the current summing amplifier circuit receives input voltage via an input terminal, and the input voltage is passed through a low-pass filter to remove at least one of a high-frequency noise and an interference, and generate a filtered version of the received input voltage, and wherein the filtered version of the received input voltage is amplified using a first transistor associated with the current summing amplifier circuit, to generate an amplified version of the filtered input voltage; and
generating, by the linear LDOVR system, a feed-forward output voltage using the level-shifted error amplified signal, based on a summation of the filtered version of the input voltage, and an output voltage of the error amplifier circuit;
level-shifting, by the linear LDOVR system, the generated feed-forward output voltage by using a gate-source voltage of a third transistor associated with a Dynamic Current Bleeder (DCB) circuit, to generate a level-shifted output voltage, wherein the level-shifted output voltage corresponds to a source voltage of the third transistor;
determining, by the linear LDOVR system, via a bleed transistor, if the generated level-shifted output voltage is greater than a threshold voltage of the bleed transistor associated with the DCB circuit;
switching-on dynamically, by the linear LDOVR system, the bleed transistor to bleed a current from the output node of the linear LDOVR system, when the determined level-shifted output voltage is greater than the threshold voltage of the bleed transistor associated with the DCB circuit, wherein bleeding the current comprises reducing a gate voltage of a pass switch transistor connected in parallel to an input node of the DCB circuit, and the output node of the DCB circuit and the linear LDOVR system; and
creating, by the linear LDOVR system, via a miller effect, a dominant pole at the output node of the error amplifier circuit, using a Compensation capacitor (Cc);
optimizing, by the linear LDOVR system, a Power Supply Rejection (PSR) response of the linear LDOVR system, by using the current summing amplifier circuit, and optimize a load transient response and a line transient response of the linear LDOVR system, using a boost and reduce amplifier circuit;

sensing, by the linear LDOVR system, via a feedback loop, the output voltage of the linear LDOVR system, using the boost and reduce amplifier circuit;

detecting, by the linear LDOVR system, an event comprising at least one of a droop signal and a shoot signal via a first capacitor C1 associated with the boost and reduce amplifier circuit, based on the sensed output voltage of the linear LDOVR system;

amplifying and inverting, by the linear LDOVR system, the output voltage of the linear LDOVR system, based on detecting the event comprising at least one of the droop signal and the shoot signal at the output voltage of the linear LDOVR system;

boosting, by the linear LDOVR system, a tail current in a tail node of the error amplifier circuit, when the detected event corresponds to the droop signal, using the amplified and inverted output voltage of the linear LDOVR system;

reducing, by the linear LDOVR system, the tail current in the tail node of the error amplifier circuit, when the detected event corresponds to the shoot signal, to decrease a magnitude of at least one of the droop signal and the shoot signal, and for enhancing the load transient response and the line transient response;

generating, by the linear LDOVR system, a divided feedback voltage from the output voltage of the linear LDOVR system, to regulate the error amplified signal of the error amplifier circuit, using a resistive ratio of a resistive divider circuit, corresponding to a feedback factor, using the resistive divider circuit;

receiving, by the linear LDOVR system, a gate voltage associated with the pass switch transistor, based on the feed-forward output voltage from the current summing amplifier circuit, using the pass switch transistor; and regulating, by the linear LDOVR system, the output voltage of the linear LDOVR system, based on the received gate voltage corresponding to the feed-forward output voltage from the current summing amplifier circuit.

14. The linear LDOVR method of claim 13, further comprising:

sensing, by the linear LDOVR system, via the third transistor, a level-shifted gate voltage of the pass switch transistor, when the linear LDOVR system is in at least one of an initial turn on condition, a no-load current condition, and a minimal current drawing condition;

activating, by the linear LDOVR system, the bleed transistor, based on the sensed level-shifted gate voltage of the pass switch transistor, for turning on the linear LDOVR system, by bleeding current to isolate the dominant pole of the linear LDOVR system from a second pole at the output node of the LDOVR system of a closed-loop transfer function associated with the linear LDOVR system;

determining, by the linear LDOVR system, if at least one load connected to the output node of the linear LDOVR system is drawing current from the linear LDOVR system, during the minimal current drawing condition;

reducing, by the linear LDOVR system, the gate voltage of the pass switch transistor, by a LDO regulation loop, for minimizing a level-shifted voltage at a source terminal of the third transistor associated with the DCB circuit by a same amount of the minimized gate voltage of the pass switch transistor; and deactivating, by the linear LDOVR system, the bleed transistor for reducing a quiescent current to optimize the load transient response and the line transient response of the linear LDOVR system, based on reducing the gate voltage of the pass switch transistor.

15. The linear LDOVR method of claim 13, further comprising:

adjusting, by the linear LDOVR system, at least one of a Direct Current (DC) Power Supply Rejection (PSR) and an Alternating Current (AC) high frequency Power Supply Rejection (PSR) via at least one of a Resistor Field Effect Transistor (RFET) comprising a resistive value determined by a RFET control voltage generated by a first Digital-to-Analog Converter (DAC) and a Capacitor FET (CFET) comprising a capacitor value determined by a CFET control voltage generated by a second DAC; and adjusting, by the linear LDOVR system, a Power Supply Rejection (PSR) associated with the linear LDOVR system, based on a plurality of applications and a plurality of input voltage sources, using the RFET and the CFET.

16. The linear LDOVR method of claim 13, further comprising:

generating, by the linear LDOVR system, the feed-forward output voltage based on current mirroring the input voltage to the current summing amplifier circuit with the feed-forward output voltage, wherein the second transistor associated with the current summing amplifier circuit comprises high input impedance at a gate terminal of the second transistor, and the output node of the current summing amplifier circuit comprises low output impedance, enabling the output node of the error amplifier circuit to be buffered from the pass switch transistor.

17. A voltage regulator comprising:

a feed-forward stage comprising:

a current summing amplifier circuit communicatively coupled to an output node of an error amplifier circuit, wherein the current summing amplifier circuit is configured to:

receive an error amplified signal from the error amplifier circuit, and an input voltage via an input terminal of the current summing amplifier circuit, wherein the received input voltage is passed through a low-pass filter to remove at least one of a high-frequency noise and an interference, and generate a filtered version of the received input voltage, and wherein the filtered version of the received input voltage is amplified using a first transistor associated with the current summing amplifier circuit, to generate an amplified version of the filtered input voltage, wherein the input voltage via the input terminal is connected to a source of one or more transistors of the current summing amplifier, and parasitically coupled to a gate of the first transistor;

level-shift the received error amplified signal by using a gate-source voltage of a second transistor associated with the current summing amplifier circuit; and generate a feed-forward output voltage using the level-shifted error amplified signal, based on a summation of the filtered version of the input voltage and an output voltage of the error amplifier circuit;

a Dynamic Current Bleeder (DCB) circuit communicatively coupled between an output node of the current summing amplifier circuit and an output node of the voltage regulator, wherein the DCB circuit is configured to:
  receive the feed-forward output voltage from the current summing amplifier circuit;
  level-shift the received feed-forward output voltage by using a gate-source voltage of a third transistor associated with the DCB circuit, to generate a level-shifted output voltage, wherein the level-shifted output voltage corresponds to a source voltage of the third transistor;
  determine, a bleed transistor, if the generated level-shifted output voltage is greater than a threshold voltage of the bleed transistor associated with the DCB circuit; and
  switch-on dynamically, the bleed transistor to bleed a current from the output node of the linear LDOVR system, when the determined level-shifted output voltage is greater than the threshold voltage of the bleed transistor associated with the DCB circuit, wherein bleeding the current comprises reducing a gate voltage of a pass switch transistor connected in parallel to an input node of the DCB circuit, and the output node of the DCB circuit and the voltage regulator; and
a Compensation capacitor (Cc) communicatively coupled between the output node of the error amplifier circuit and the output node of the voltage regulator, wherein the Cc is configured to:
  create, via a miller effect, a dominant pole at the output node of the error amplifier circuit; and
  optimize a Power Supply Rejection (PSR) response of the voltage regulator, by using the current summing amplifier circuit, and optimize a load transient response and a line transient response of the voltage regulator, using a boost and reduce amplifier circuit;
a feed-back stage comprising:
  the boost and reduce amplifier circuit communicatively coupled to the output node of the voltage regulator, wherein the boost and reduce amplifier circuit is configured to:
    sense, via a feedback loop, the output voltage of the voltage regulator;
    detect an event comprising at least one of a droop signal and a shoot signal via a first capacitor C1 associated with the boost and reduce amplifier circuit, based on the sensed output voltage of the voltage regulator;
    amplify and invert the output voltage of the voltage regulator, based on detecting the event comprising at least one of the droop signal and the shoot signal at the output voltage of the voltage regulator;
    boost a tail current in a tail node of the error amplifier circuit, when the detected event corresponds to the droop signal, using the amplified and inverted output voltage of the voltage regulator; and
    reduce the tail current in the tail node of the error amplifier circuit, when the detected event corresponds to the shoot signal, to decrease a magnitude of at least one of the droop signal and the shoot signal, and for enhancing the load transient response and the line transient response; and
a resistive divider circuit communicatively coupled to the output node of the voltage regulator and an input node of the error amplifier circuit, wherein the resistive divider circuit is configured to:
  generate a divided feedback voltage from the output voltage of the voltage regulator, to regulate the error amplified signal of the error amplifier circuit, using a resistive ratio of the resistive divider circuit, corresponding to a feedback factor.

18. The voltage regulator of claim 17, further comprising:
a second stage comprising the pass switch transistor, wherein the pass switch transistor comprising an input node is communicatively coupled between the output node of the current summing amplifier circuit and the input node of the DCB circuit, and an output node of the pass switch transistor is communicatively coupled to the input node of the error amplifier circuit, wherein the pass switch transistor is configured to:
  receive a gate voltage associated with the pass switch transistor, based on the feed-forward output voltage from the current summing amplifier circuit; and
  regulate the output voltage of the voltage regulator, based on the received gate voltage corresponding to the feed-forward output voltage from the current summing amplifier circuit.

19. The voltage regulator of claim 17, wherein the DCB circuit is further configured to:
  sense, via the third transistor, a level-shifted gate voltage of the pass switch transistor, when the voltage regulator is in at least one of an initial turn on condition, a no-load current condition, and a minimal current drawing condition;
  activate the bleed transistor, based on the sensed level-shifted gate voltage of the pass switch transistor, for turning on the voltage regulator, by bleeding current to isolate the dominant pole of the voltage regulator from a second pole at the output node of the voltage regulator of a closed-loop transfer function associated with the voltage regulator;
  determine, if at least one load connected to the output node of the voltage regulator is drawing current from the voltage regulator, during the minimal current drawing condition;
  reduce the gate voltage of the pass switch transistor, by a LDO regulation loop, for minimizing a level-shifted voltage at a source terminal of the third transistor associated with the DCB circuit by a same amount of the minimized gate voltage of the pass switch transistor; and
  deactivate the bleed transistor for reducing a quiescent current to optimize the load transient response and the line transient response of the voltage regulator, based on reducing the gate voltage of the pass switch transistor.

20. The voltage regulator of claim 17, wherein the current summing amplifier circuit is further configured to:
  adjust at least one of a Direct Current (DC) Power Supply Rejection (PSR) and an Alternating Current (AC) high frequency Power Supply Rejection (PSR) via at least one of a Resistor Field Effect Transistor (RFET) comprising a resistive value determined by a RFET control voltage generated by a first Digital-to-Analog Converter (DAC) and a Capacitor FET (CFET) comprising a capacitor value determined by a CFET control voltage generated by a second DAC; and
  wherein the RFET and the CFET are configured to:
    adjust a Power Supply Rejection (PSR) associated with the voltage regulator, based on a plurality of applications and a plurality of input voltage sources.

* * * * *